(12) United States Patent
Kumagai et al.

(10) Patent No.: US 7,141,937 B2
(45) Date of Patent: Nov. 28, 2006

(54) HIGH-PRESSURE DISCHARGE LAMP OPERATION DEVICE AND ILLUMINATION APPLIANCE HAVING THE SAME

(75) Inventors: Jun Kumagai, Kadoma (JP); Akihiro Kishimoto, Osaka (JP); Hirofumi Konishi, Hirakata (JP)

(73) Assignee: Matsushita Electric Works, Ltd., Osaka (JP)

( * ) Notice: Subject to any disclaimer, the term of this patent is extended or adjusted under 35 U.S.C. 154(b) by 3 days.

(21) Appl. No.: 10/532,822

(22) PCT Filed: Sep. 26, 2003

(86) PCT No.: PCT/JP03/12319

§ 371 (c)(1),
(2), (4) Date: Apr. 26, 2005

(87) PCT Pub. No.: WO2004/039130

PCT Pub. Date: May 6, 2004

(65) Prior Publication Data

US 2006/0049777 A1    Mar. 9, 2006

(30) Foreign Application Priority Data

Oct. 28, 2002 (JP) ............................. 2002-312484
Oct. 31, 2002 (JP) ............................. 2002-318934

(51) Int. Cl.
*H05B 37/02* (2006.01)
*G05F 1/00* (2006.01)

(52) U.S. Cl. ....................... 315/224; 315/226; 315/291

(58) Field of Classification Search ................ 315/224, 315/226, 209 R, 291, 307
See application file for complete search history.

(56) References Cited

U.S. PATENT DOCUMENTS 4,912,374 A    3/1990    Nagase et al. ............... 315/224

(Continued)

FOREIGN PATENT DOCUMENTS

EP    0314077    1/1994

(Continued)

OTHER PUBLICATIONS

English Language Abstract of JP 2000-058284.

(Continued)

*Primary Examiner*—Hoanganh Le
*Assistant Examiner*—Tung Le
(74) *Attorney, Agent, or Firm*—Greenblum & Bernstein, P.L.C.

(57) ABSTRACT

A full bridge circuit including four switching elements (Q1 to Q4) is alternated with a high switching frequency and a series-connected resonance circuit (5) including an inductor (L2) and a capacitor (C2) is made to resonate at a switching frequency of the full bridge circuit multiplied by an integer (for example, frequency multiplied by three), thereby generating a high voltage pulse for start up. After a high-pressure discharge lamp (DL) is started up, the full bridge circuit is alternated with a low switching frequency so as to operate as a step-down chopper for inverting the output polarity, thereby stably supplying rectangular wave voltage of low frequency to the high-pressure discharge lamp (DL) via a filter circuit including an inductor (L1) and a capacitor (C1).

53 Claims, 26 Drawing Sheets

U.S. PATENT DOCUMENTS

| | | | |
|---|---|---|---|
| 5,569,984 A | 10/1996 | Holtslag | 315/307 |
| 5,923,127 A | 7/1999 | Keijser et al. | 315/224 |
| 5,932,976 A | 8/1999 | Maheshwari et al. | 315/291 |
| 6,124,682 A * | 9/2000 | Lakin et al. | 315/291 |
| 6,144,172 A * | 11/2000 | Sun | 315/291 |
| 6,380,694 B1 * | 4/2002 | Uchihashi et al. | 315/244 |
| 6,593,703 B1 * | 7/2003 | Sun | 315/224 |
| 6,861,812 B1 * | 3/2005 | Kambara et al. | 315/291 |
| 2002/0047609 A1 * | 4/2002 | Weng | 315/224 |

FOREIGN PATENT DOCUMENTS

| | | |
|---|---|---|
| JP | 59-18460 | 2/1984 |
| JP | 63-149566 | 10/1988 |
| JP | 5-198911 | 8/1993 |
| JP | 5-327161 | 12/1993 |
| JP | 6-5191 | 1/1994 |
| JP | 9-282927 | 10/1997 |
| JP | 10-284265 | 10/1998 |
| JP | 11-111040 | 4/1999 |
| JP | 2000-058284 | 2/2000 |
| JP | 2000-357617 | 12/2000 |
| JP | 2001-297922 | 10/2001 |
| JP | 2002-140926 | 5/2002 |
| JP | 2002-170425 | 6/2002 |
| WO | 96/20578 | 7/1996 |
| WO | 97/42650 | 11/1997 |
| WO | 00/78100 | 12/2000 |

OTHER PUBLICATIONS

English Language Abstract of JP 2001-297922.
English Language Abstract of JP 2002-170425.
English Language Abstract of JP 5-198911. Aug. 6, 1993.
English Language Abstract of JP 2002-140926.
English Language Abstract of JP 9-282927. Oct. 31, 1997.
English Language Abstract of JP 11-111040. Apr. 23, 1999.
English Language Abstract of JP 5-327161. Dec. 10, 1993.

* cited by examiner

Fig.2C V<sub>N2</sub>

Fig. 7C V<sub>N2</sub>

*Fig.7C* V<sub>N2</sub>

HIGH-PRESSURE DISCHARGE LAMP OPERATION DEVICE AND ILLUMINATION APPLIANCE HAVING THE SAME

TECHNICAL FIELD

The present invention relates to a lighting device for a high-pressure discharge lamp and a light fixture which is equipped with the lighting device and, more particularly, to a high-pressure discharge lighting device which can be attached to a power track or the like in a small space and a light fixture which is equipped with such a high-pressure discharge lighting device.

BACKGROUND ART

There is a conventional light fixture which is used after being attached to a power track arranged on a ceiling or the like. Such a light fixture includes a lamp and a down-transformer section serving as a device for lighting the lamp. However, since the size of the down-transformer section is not so small that the down-transformer section can be stored in the power track, the down-transformer section is stored in an outer envelope arranged independently of the lamp, and the down-transformer section is arranged under the power track. Therefore, the lamp and the outer envelope disadvantageously overhang under the power track in appearance. As a method of reducing the circuit of the down-transformer section to suppress the overhang of the outer envelope, the following two methods, i.e., a method of reducing the circuit of the down-transformer section and a method of devising a structure of a printed circuit board on which the electronic parts of the down-transformer section are mounted to reduce the down-transformer section in size are known.

In the two solving methods, a light fixture including the down-transformer section which is reduced in size to have preferable appearance when attached to the power track is proposed in JP11-111040A. However, this light fixture uses, as a lamp, an incandescent lamp lighted by the down-transformer section, a halogen lamp, or the like. On the other hand, a light fixture using a high-pressure discharge lamp such as an HID (High Intensity Discharged) lamp has a problem in which the circuit cannot be reduced much in size, since the number of parts is large due to a complex circuit configuration of the device for lighting the high-pressure discharge lamp (as described later) and temperatures of the electronic parts increase.

FIG. 28 shows a basic circuit of a conventional high-pressure discharge lamp lighting device. The device includes a rectifier circuit 92 containing a step-up chopper, a power control circuit 97 containing a step-down chopper, a polarity inversion circuit 93 containing a full bridge circuit, an high-pressure pulse generation circuit Ig, a control circuit 96 for performing drive control of a switching element Q95 for the step-up chopper, and a control circuit 98 for performing drive control for a switching element Q96 for the step-down chopper. Each circuit will be described below.

The rectifier circuit 92 includes a so-called step-up chopper circuit containing an inductor L93, a diode D95, a capacitor C95, and a switching element Q95 such as a MOSFET (Metal Oxide Silicon Field Effect Transistor) and a bridge rectifier DB. The bridge rectifier DB fully rectifies an AC voltage from a commercial AC power supply AC to generate a pulsating-flow voltage. The step-up chopper circuit converts the pulsating-flow voltage generated by the bridge rectifier DB into a DC voltage to output the DC voltage.

The power control circuit 97 contains the switching element Q96 such as a MOSFET turning on/off at several 10 KHz, a diode D96, an inductor L94, and a capacitor C96, an output current of which is of chopping-wave shape. A voltage depending on an output current output from the power control circuit 97 is induced at the secondary winding of the inductor L94. The induced voltage is input to the control circuit 98 through a series-connected resistor R94. The control circuit 98 performs zero-cross switching control of the switching element Q96 on the basis of the voltage input from the secondary winding of the inductor L94. The capacitor C96 is used to remove harmonic components from the output current of a primary winding of the inductor L94.

The polarity inversion circuit 93 converts a DC voltage from the power control circuit 97 into a rectangular wave AC voltage having a low frequency of several 100 Hz through a full-bridge circuit including switching elements Q91 to Q94 such as MOSFETs and supplies the rectangular wave AC voltage to a high-pressure discharge lamp DL.

The high-pressure pulse generation circuit Ig is for generating a high-pressure pulse to cause dielectric breakdown between the electrodes of the high-pressure discharge lamp DL, and is used to start the high-pressure discharge lamp DL. After the high-pressure discharge lamp DL is started, the operation of the high-pressure pulse generation circuit Ig is halted.

The light fixture including the high-pressure discharge lamp DL lighted by the lighting device is disclosed in JP14-75045A. It is desired that the circuit of the lighting device is changed to be smaller so as to reduce the light fixture in size.

On the other hand, as another solving method, a method of devising the structure of a printed circuit board on which electronic parts are mounted to reduce an electronic circuit module in size is proposed in JP5-327161A. This has a structure in which an auxiliary circuit board is arranged perpendicularly to a main circuit board. The auxiliary circuit board has one pair of substrate support sections projecting from both the longitudinal ends to the main circuit board side, and the main circuit board has fixing holes into which the substrate support sections of the auxiliary circuit board penetrate. When the auxiliary circuit board is mounted on the main circuit board, the substrate support sections are inserted into the fixing holes, so that the auxiliary circuit board can be held perpendicularly to the main circuit board. In this manner, the electronic parts to be mounted on the printed board can be three-dimensionally mounted on the main circuit board and the auxiliary circuit board, and therefore the electronic circuit module can be reduced in size.

However, in this mounting structure, a plurality of terminal pads aligned along the long side of the auxiliary circuit board and a plurality of pads aligned on the upper surface of the main circuit board are soldered on the parts surface side of the main circuit board. For this reason, for example, in case that the soldered surface of the main circuit board is dipped into a solder tank while the auxiliary circuit board is mounted on the parts surface of the main circuit board to solder the part leads of the main circuit board, the auxiliary circuit board cannot be connected to the main circuit board simultaneously with the parts. As a matter of course, even in this mounting structure, if all the parts on the main circuit board are mounted on the upper surface of the main circuit board simultaneously with the auxiliary circuit board, soldering of the parts on the main circuit board and soldering of the auxiliary circuit board and the main circuit board can be simultaneously performed.

However, as indicated in the reference, when the surface mounting is done, reflow soldering is performed, and thus heating by the reflow soldering causes another problem such as positioning errors of the parts mounted on the auxiliary circuit board. In order to prevent the positioning errors, another member which holds the parts on the auxiliary circuit board to prevent the positioning errors of the parts is required to increase the cost disadvantageously. The substrate support sections of the auxiliary circuit board are easily broken. If the substrate support sections are broken, all the substrates cannot be used. Furthermore, since the auxiliary circuit board is mounted on the upper surface (surface on which electronic parts are mounted) of the main circuit board, the terminal pads of the auxiliary circuit board are located above the upper surface of the main circuit board. Therefore, the electronics parts to be mounted on the auxiliary circuit board are mounted at positions which are above the terminal pads and which is distant from the upper surface of the main circuit board, so that the height of the projection of the auxiliary circuit board from the upper surface of the main circuit board is made difficult to be small. For this reason, the electronic circuit module on which the electronic parts cannot be easily downsized.

The present invention has been made in consideration of the above problems, and has as its object to provide a compact high-pressure discharge lamp lighting device and a light fixture equipped with the high-pressure discharge lamp lighting device.

DISCLOSURE OF INVENTION

In order to achieve the above object, a device for lighting a high-pressure discharge lamp according to the invention includes a DC power supply, a first switching element having one terminal connected to the high-pressure side of the DC power supply, a second switching element having one terminal connected to the low-voltage side of the DC power supply, a third switching element having one terminal connected to the high-pressure side of the DC power supply, a fourth switching element having one terminal connected to the low-voltage side of the DC power supply, a first inductor having one terminal connected to the other terminals of the first and second switching elements, and the other terminal connected to one terminal of the high-pressure discharge lamp, a first capacitor connected between an intermediate section of a winding of the first inductor and the low-voltage side of the DC power supply, and composing a first series resonant circuit together with the first inductor, a second capacitor having one terminal connected to the one terminal of the first inductor, and the other terminal connected to the other terminal of the high-pressure discharge lamp, a second inductor having one terminal connected to the other terminals of the third and fourth switching elements, and the other terminal connected to the other terminal of the second capacitor, and a control circuit for controlling turning on and off of the first to fourth switching elements. In this configuration, the control circuit, before the high-pressure discharge lamp is started up, performs control in a first control mode which alternately switches between a state in which the first and fourth switching elements are on and the second and third switching elements are off and a state in which the first and fourth switching elements are off and the second and third switching elements are on, at a predetermined switching frequency. In the first control mode, the first series resonant circuit is resonated at a frequency of integral times the switching frequency to generate a high voltage for starting up the high-pressure discharge lamp.

The control circuit, after the high-pressure discharge lamp is started up, may perform control in a second control mode which alternately switches at a low-frequency between, an operation for alternately switching at a high-frequency between a state in which the first and fourth switching elements are simultaneously on, and a state in which at least one of the first and fourth switching elements is off, and an operation for alternately switching at a high-frequency between a state in which the second and third switching elements are simultaneously on and a state in which at least one of the second and third switching elements is off.

Alternatively, a device for lighting a high-pressure discharge lamp according to the invention, includes a DC power supply, a first switching element having one terminal connected to the high-pressure side of the DC power supply, a second switching element having one terminal connected to the low-voltage side of the DC power supply, a first inductor having one terminal connected to the other terminals of the first and second switching elements, and the other terminal connected to one terminal of a high-pressure discharge lamp, a first capacitor connected between an intermediate section of a winding of the first inductor and the low-voltage side of the DC power supply and composing a first series resonant circuit together with the first inductor, a second capacitor having one terminal connected to the one terminal of the first inductor, and the other terminal connected to the other terminal of the high-pressure discharge lamp, a second inductor having one terminal connected to the other terminal of the second capacitor, a third capacitor connected between the high-pressure side of the DC power supply and the other terminal of the second inductor, a fourth capacitor connected between the low-voltage side of the DC power supply and the other terminal of the second inductor, and a control circuit for controlling turning on and off of the first and second switching elements. The control circuit, before the high-pressure discharge lamp is started up, performs control in a first control mode which alternately switches between a state in which the first switching element is on and the second switching element is off and a state in which the first switching element is off and the second switching element is on, at a predetermined switching frequency. In the first control mode, the first series resonant circuit is resonated at a frequency of integral times the switching frequency to generate a high voltage for starting up the high-pressure discharge lamp.

The control circuit, after the high-pressure discharge lamp is started up, may perform control in a second control mode which alternately switches at a first low-frequency between an operation for controlling turning on and off of the first switching element at a high-frequency and an operation for controlling turning on and off the second switching element at a high-frequency.

The switching frequency may be lower than a resonant frequency of the first series resonant circuit and higher than a resonant frequency of a second series resonant circuit including the second inductor and the second capacitor.

In the first control mode, a frequency of a high voltage generated by the first series resonant circuit may be $(2n+1)$ (n is a natural number) times the switching frequency.

The switching frequency may be higher than two times the resonant frequency of a second series resonant circuit including the second inductor and the second capacitor.

According to the high-pressure discharge lamp lighting device as described above, since resonant voltage stepping-up is performed at a frequency corresponding to an integral multiple of the switching frequency of a switching element, the resonant inductor can be considerably reduced in size, and the size and cost of the high-pressure discharge lamp lighting device can be made smaller than a conventional high-pressure discharge lamp lighting device. In addition, since the switching frequency of the switching element is not different from a conventional switching frequency, switching loss can be prevented from increasing.

The control circuit may vary the switching frequency depending on time in the first control mode. Thus, the advantage of being able to generate a stable high-pressure pulse even though the frequency characteristics of the impedance of the first series resonant circuit change due to a fluctuation of the parts can be obtained.

A variable range of the switching frequency may be set such that the resonant frequency of the first series resonant circuit is included in a range from an integral multiple of the lower limit of the variable range to an integral multiple of the upper limit of the variable range. Thus the advantage of being able to easily generate a stable high-pressure pulse having a high voltage even though the frequency characteristics of the impedance of the series resonant circuit change due to a fluctuation of the parts can be obtained.

Furthermore, the frequency corresponding to the integral multiple of the switching frequency may be (2N+1) times (n is a natural number) the switching frequency. Thus, the variable range of the frequency being (2n+1) times (n is a natural number) the switching frequency includes the resonant frequency of the first series resonant circuit, and the switching frequency is relatively easily made variable to make it possible to generate the (2n+1)-times frequency. The advantage of being able to stably generate a high-pressure pulse can be obtained.

The frequency corresponding to the integral multiple of the switching frequency may be three times the switching frequency. Thus, a high-pressure pulse having a voltage which is almost equal to that of a conventional high-pressure pulse can be generated more easily than a high-pressure pulse generated at a frequency which is an integral multiple (three or more times) the switching frequency. For this reason, activation capability at a level equal to the level of conventional activation capability can be maintained.

Furthermore, the control circuit may have a digital arithmetic processing circuit, and the switching frequency may be discretely varied by the digital arithmetic processing circuit. Thus, not only a one-way descending variation of the frequency but also the number of repetitions at a constant frequency can be easily set.

The control circuit may have an analog arithmetic processing circuit, and the switching frequency may be continuously varied by the analog arithmetic processing circuit. Thus, the frequency can be continuously changed, and the advantage of being able to reliably generate a high-pressure pulse obtained from the impedance characteristics of the first series resonant circuit can be obtained.

Furthermore, the first and second switching elements are PWM-controlled at a duty ratio of about 50%, and the first and second switching elements alternately repeat on and off-operations at equal time intervals. Thus, control signals of the switching elements can be generated by a simple control circuit, and the advantage of being able to realize reductions in size and cost of the high-pressure discharge lamp lighting device can be obtained.

The first inductor may have a transformer structure provided with a primary winding and a secondary winding, one terminal of the primary winding is connected to one terminal of the secondary winding, and the first capacitor may be connected to the connection point between the primary winding and the secondary winding. In this manner, a high-pressure pulse required to light a lamp can be generated by a small inductor, and the advantage of being able to reduce the size and cost of the high-pressure discharge lamp lighting device can be obtained.

The first inductor may have a transformer structure provided with a primary winding and a secondary winding, and a ratio of the numbers of turns of the primary winding and the secondary winding may be given by 1:N (N>1). Therefore, a first series resonant voltage for generating a high-pressure pulse can be low, and a resonant current can be reduced. For this reason, the advantage of being able to reduce the sizes of the first inductor and the first capacitor constituting the first series resonant circuit can be obtained.

Furthermore, the first inductor has a transformer structure provided with a primary winding and a secondary winding, the primary winding is constituted by a litz wire, and the secondary winding is constituted by a single wire. Thus, the resistance of the primary winding in a high-frequency region can be reduced, and the DC resistance of the secondary winding can be reduced. A high-pressure pulse required to light the discharge lamp can be generated by using a small transformer, and the advantage of being able to suppress heat from being generated by the transformer in an on-state of the high-pressure discharge lamp can be obtained.

The lighting device may further include a start up detector operable to detect the start up of the high-pressure discharge lamp. When the start up detector detects the start up of the high-pressure discharge lamp, the control circuit performs control in a third control mode. The third control mode alternately switches at a low-frequency between: an operation for switching at a high-frequency among, a state in which the first and fourth switching elements are simultaneously on, a state in which one of the first and fourth switching elements is off, and a state in which both the first and fourth switching elements are off, sequentially in the order; and an operation for switching at a high-frequency among, a state in which the second and third switching elements are simultaneously on, a state in which one of the second and third switching elements is off, and a state in which both the second and third switching elements are off, sequentially in the order. Thus, the advantage of being able to prevent an unstable state in which a lamp current generated immediately after the high-pressure discharge lamp is lighted is stopped to make a lighting state stable can be obtained.

A switching operation from the first control mode to the third control mode may be conducted when a predetermined period of time passes after the start up of the high-pressure discharge lamp is detected. Thus, when the high-pressure discharge lamp is turned off until a predetermined period of time has elapsed after the lighting state of the high-pressure discharge lamp is detected, the advantage of being able to generate a high-pressure pulse again can be obtained.

A switching operation from the first control mode to the third control mode may be conducted when a predetermined period of time passes after the start up of the high-pressure discharge lamp is detected. Thus, impedance characteristics between bridges immediately after the high-pressure discharge lamp is lighted can be reduced, and a higher current can be supplied to the high-pressure discharge lamp, and the advantage of being able to prevent an unstable state in which a current flowing in the high-pressure discharge lamp is stopped can be obtained.

The lighting device may further include a main circuit board and an auxiliary circuit board on which the electronic parts comprised in the high-pressure discharge lamp lighting device can be mounted. Terminal pads for soldering connection to the main circuit board may be formed on both the upper and lower surfaces of the lower part of the auxiliary circuit board. A slit in which the auxiliary circuit board is inserted and which supports the auxiliary circuit board may be formed in the main circuit board. The slit may have a portion which has a first width and is electrically connected to the auxiliary circuit board and a portion which has a second width which is almost equal to or smaller than the thickness of the auxiliary circuit board. The first width may be larger than the second width. In this manner, the terminal pads of the auxiliary circuit board are arranged on a surface on which soldering is performed, not a surface on which the parts of the main circuit board are mounted, a space for part leads of the main circuit board projecting to the soldering surface side of the main circuit board is effectively used to make it possible to reduce the height of the projection of the auxiliary circuit board from the upper surface of the main circuit board, and a low-profile high-pressure discharge lamp lighting device can be realized. In the step of inserting and connecting the auxiliary circuit board to the main circuit board, the auxiliary circuit board can be prevented from falling down before the auxiliary circuit board is soldered. The manufacturing cost and the parts cost can be further reduced.

Further projecting portions which can be in contact with the surface of the main circuit board when the auxiliary circuit board may be inserted into the main circuit board is formed in a space between the terminal pads formed on the lower part of the auxiliary circuit board and an electronic parts mounted on the auxiliary circuit board, and on both the upper and lower surfaces of the auxiliary circuit board. For this reason, the projecting portions support the auxiliary circuit board to make it possible to manufacture the auxiliary circuit board without any jig, and the manufacturing cost and the parts cost can be further reduced.

The projecting portion may include a rod almost perpendicularly penetrates a hole running from the upper surface to the lower surface in the auxiliary circuit board. For this reason, the projecting portions can be formed with a simple configuration, and the manufacturing cost and the parts cost can be still further reduced.

The projecting portion may include an electronic part arranged between the other electronic parts mounted on both the upper and lower surfaces of the auxiliary circuit board and the terminal pads. Thus, the electronic parts also serve as the projecting portions, and the auxiliary circuit board can be supported without using special members as the projecting portions.

The projecting portion may include a U-shaped jig fixed to at least one end in the longitudinal direction of the auxiliary circuit board such that the jig straddles both the upper and lower surfaces of the auxiliary circuit board. Thus, the auxiliary circuit board can be manufactured without a large-scale jig, and the manufacturing cost and the parts cost can be reduced. As a result, reductions in size and cost of the device can be realized.

The terminal pads may be formed at symmetrical positions on the upper and lower surfaces of the auxiliary circuit board. Thus, stress generated in the auxiliary circuit board by soldering can be suppressed from being biased, and the auxiliary circuit board can be more stably connected.

Furthermore, the terminal pads formed at the symmetrical positions of the upper and lower surfaces of the lower part of the auxiliary circuit board may have electrically the same potential. Thus, wires can be minimally drawn on the main circuit board, and a circuit which is strong to external noise can be realized.

The lighting device may further include a variable resistor for output control connected to the high-pressure discharge lamp in series and mounted on the auxiliary circuit board. When the auxiliary circuit board is inserted into the main circuit board, the output control variable resistor may be positioned at a position closer to the surface of the main circuit board than an intermediate point of a height of the highest part of the auxiliary circuit board with reference to the surface of the main circuit board. Thus, the radius of a moment of force decreases, and stress acting on the solder connection portion between the auxiliary circuit board and the main circuit board can be reduced when the resistance of the output-control variable resistor is controlled.

An electric wiring pattern formed on the auxiliary circuit board may include a part to which a low voltage is applied and a part to which a high voltage is applied, and the part to which the high voltage is applied is formed on the peripheral portion of the auxiliary circuit board. Therefore, even in a small high-pressure discharge lamp lighting device, a control circuit of which does not easily perform an erroneous operation caused by self noise can be realized.

The auxiliary circuit board may be arranged near the peripheral portion of the main circuit board. Thus, heat from the electronic circuit mounted on the auxiliary circuit board can be suppressed to low levels.

A light fixture according to the present invention includes the high-pressure discharge lamp lighting device, and a high-pressure discharge lamp lighted by the high-pressure discharge lamp lighting device. Hence, a small-size light fixture can be realized, and the advantage of being able to considerably increase the degree of freedom of installation can be obtained. Therefore, an light fixture which is preferable in appearance and which uses a high-pressure discharge lamp can be realized.

BEST MODE FOR CARRYING OUT THE INVENTION

Figure 1:
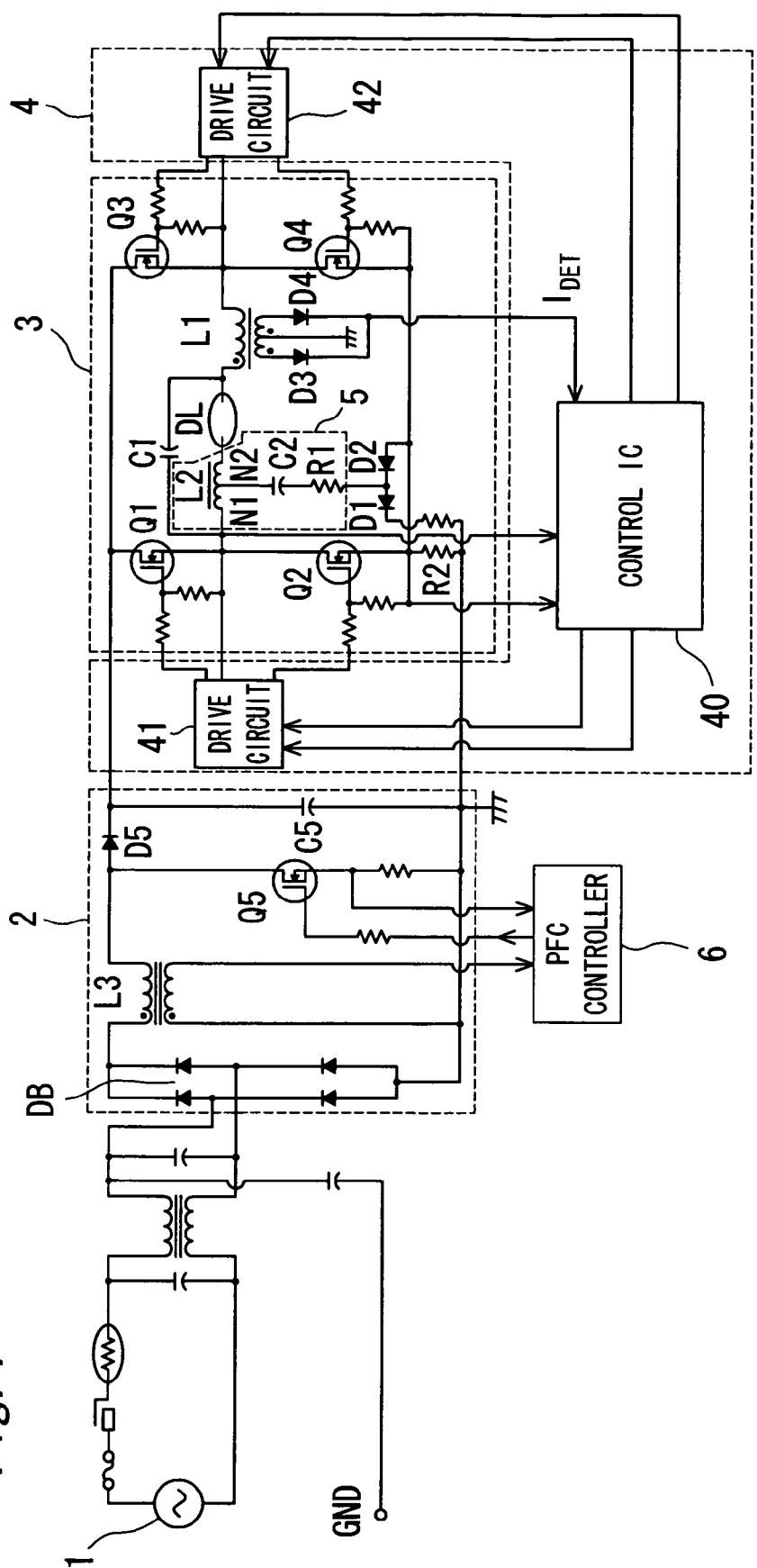
FIG. 1 is a circuit diagram according to the first embodiment of the present invention.

Embodiments of the present invention will be described below with reference to the accompanying drawings. In the drawings, constituent elements having the same reference symbols have the same functions.

First Embodiment

FIG. 1 is a circuit diagram of the first embodiment of a high-pressure discharge lamp lighting device according to the present invention. The high-pressure discharge lamp lighting device according to this embodiment includes an AC power supply 1, a rectifier circuit 2, a lighting circuit 3, a control circuit 4, a resonant circuit 5, and a power factor correction (PFC) controller 6.

The rectifier circuit 2 has a bridge rectifier DB connected to the AC power supply 1 through a noise filter circuit and a line protection device. The bridge rectifier DB performs full-wave rectification of an AC voltage supplied from the AC power supply 1 to convert the AC voltage into a DC voltage. One terminal of an inductor L3 is connected to the high-potential side of the output terminal of the bridge rectifier DB. A switching element Q5 such as a MOSFET (Metal Oxide Silicon Field Effect Transistor) is connected between the low-potential side of the output terminal and the other terminal of the inductor L3. The anode side of a diode D5 is connected to a connection point between the inductor L3 and the switching element Q5, and a capacitor C5 is connected between the cathode side of the diode D5 and the ground. The power factor correction controller 6 sends a PWM (Pulse Width Modulation) signal to the switching element Q5 according to the waveform of the DC voltage output from the bridge rectifier DB to on/off-control the switching element Q5, so that a power factor is improved such that the peak of a triangular current waveform flowing in the inductor L3 traces the waveform of the DC voltage, i.e., a phase difference between a voltage and a current flowing in the inductor L3 decreases.

A case in which the AC power supply 1 and the rectifier circuit 2 using a chopper circuit scheme are used as a power supply of the lighting circuit 3 has been described above. As the power supply, any power supply which can supply a DC power supply to the lighting circuit 3 may be used. For example, a battery or a commercial DC power supply may be used.

The lighting circuit 3 has four switching elements Q1 to Q4 arranged in a full-bridge circuit to convert a DC power supply supplied from the rectifier circuit 2 into an AC power supply to supply AC power to a high-pressure discharge lamp (to be referred to as "a lamp DL" hereinafter). As each switching element, a MOSFET including a body diode for distributing a regenerating current is used. One terminal of each of the switching elements Q1 to Q3 is connected to the high-potential side of the DC power supply. The other terminal of the switching element Q1 and one terminal of the switching element Q2 are connected in series with each other, and the other terminal of the switching element Q3 and one terminal of the switching element Q4 are connected in series with each other. The other terminals of the switching elements Q2 and Q4 are connected to the ground. An inductor L1 is connected in series between the connection point between the switching elements Q3 and Q4 and the lamp DL to regulate a load current $I_{DL}$ flowing in the lamp DL. A capacitor C1 is connected in parallel to the lamp DL to remove a ripple component of the load current $I_{DL}$ flowing in the lamp DL.

The control circuit 4 is for controlling the switching elements Q1 to Q4 such that the switching elements Q1 to Q4 perform desired switching operations. The control circuit 4 includes a control IC (Integrated Circuit) 40 and two drive circuits 41 and 42. The control IC 40 is constituted by a microcomputer or the like which performs digital arithmetic processing. The drive circuits 41 from 42 are constituted by driver ICs which control turning on and off of the switching elements Q1 to Q4 on the basis of a signal input from the control IC 40.

The resonant circuit 5 includes an inductor L2 connected in series between the connection point between the switching elements Q1 and Q2 and the lamp DL to generate a high-pressure pulse for starting up the lamp DL, a capacitor C2 having one terminal connected to the intermediate portion of the winding of the inductor L2, and a resistor R1 connected in series with the other terminal of the capacitor C2. The inductor L2 and the capacitor C2 constitute a series resonant circuit. In the series resonant circuit, the inductive reactance of the inductor L2 and the capacitive reactance of the capacitor C2 are set such that resonance occurs at a high frequency $f2 \approx 360$ KHz. The diodes D1 and D2 are used to perform a bypass operation so as to prevent a resonant current generated by the resonant circuit 5 from flowing in a current detection resistor R2 for detecting a load current $I_{DL}$ flowing in the lamp DL.

Figure 2:
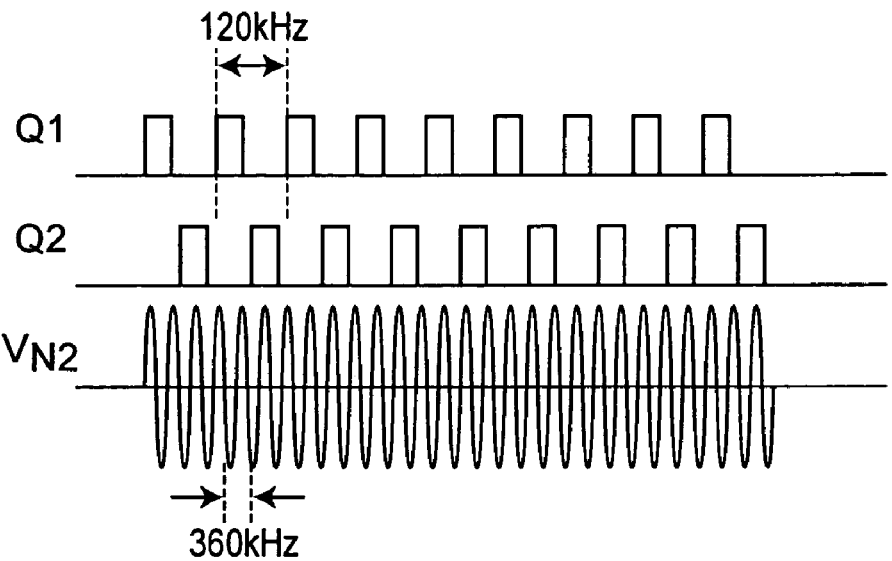
FIG. 2A is a graph showing a waveform of a drive signal supplied to a switching element Q1 in a start-up mode.
FIG. 2B is a graph showing a waveform of a drive signal supplied to a switching element Q2 in the start-up mode.
FIG. 2C is a graph showing a waveform of a voltage output from an inductor L2 in the start-up mode.
Figure 3:
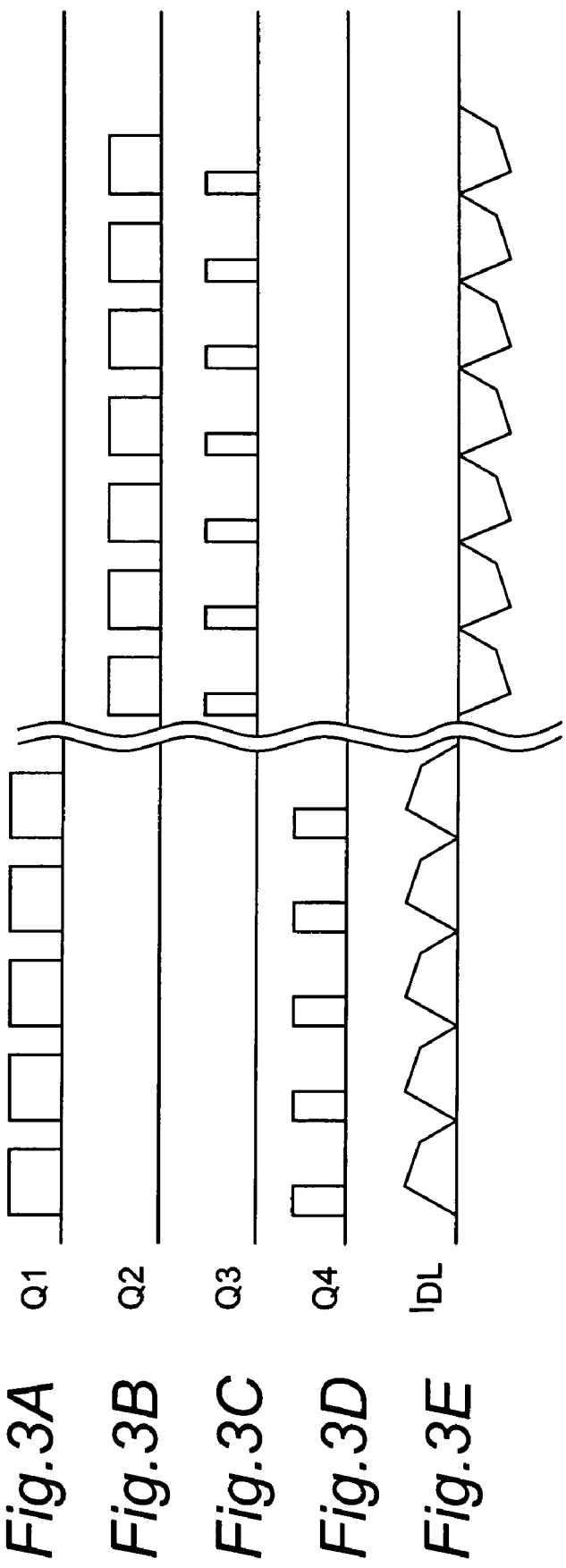
FIG. 3A is a graph showing a waveform of a drive signal supplied to the switching element Q1 in a low-voltage lighting mode.
FIG. 3B is a graph showing a waveform of a drive signal supplied to the switching element Q2 in the low-voltage lighting mode.
FIG. 3C is a graph showing a drive signal supplied to a switching element Q3 in the low-voltage lighting mode.
FIG. 3D is a graph showing a waveform of a drive signal supplied to a switching element Q4 in the low-voltage lighting mode.
FIG. 3E is a graph showing a waveform of a current flowing in a lamp DL in the low-voltage lighting mode.
Figure 4:
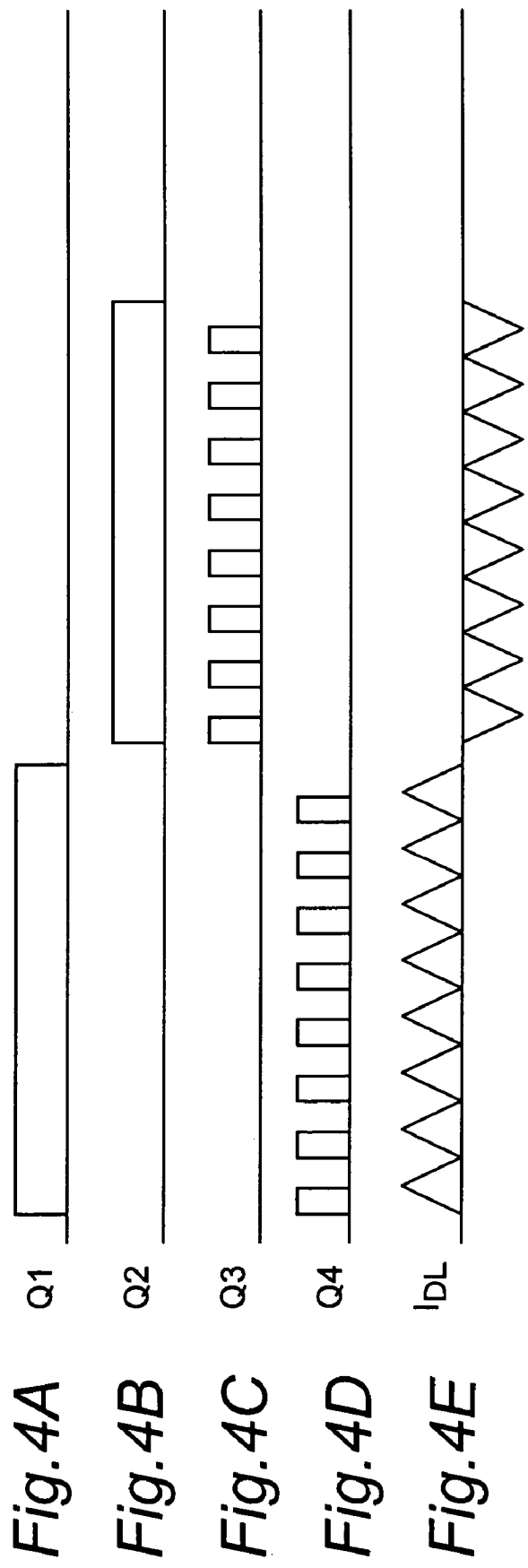
FIG. 4A is a graph showing a waveform of a drive signal supplied to the switching element Q1 in a stable lighting mode.
FIG. 4B is a graph showing a waveform of a drive signal supplied to the switching element Q2 in the stable lighting mode.
FIG. 4C is a graph showing a waveform of a drive signal supplied to the switching element Q3 in the stable lighting mode.
FIG. 4D is a graph showing a waveform of a drive signal supplied to the switching element Q4 in the stable lighting mode.
FIG. 4E is a graph showing a waveform of a current flowing in the lamp DL in the stable lighting mode.

A lighting operation of the high-pressure discharge lamp lighting device according to the present embodiment will be described below with reference to FIGS. 2 to 4. The lighting operation includes an start-up mode in which a high-pressure pulse is applied across the electrodes of the lamp DL to cause dielectric breakdown between the electrodes, a low-voltage lighting mode in which a voltage across the electrodes is low although the dielectric breakdown between the electrodes occurs, and a stable lighting mode in which the voltage across the electrodes also increases to stably light the lamp. Operations in these modes will be described below.

(Start-Up Mode)

In order to start up the lamp DL, a high-pressure must be applied across the electrodes of the lamp DL to cause dielectric breakdown between the electrodes. In this high-pressure discharge lamp lighting device, the series resonant circuit constituted by the inductor L2 and the capacitor C2 is resonated at a frequency $f2 \approx 360$ KHz. Thus, as shown in FIGS. 2A and 2B, the switching elements Q1 and Q2 are alternately turned on/off at a frequency of 120 KHz which is ⅓ of the resonant frequency $f2 \approx 360$ KHz of an output terminal voltage $V_{N2}$ of a secondary winding N2 of the inductor L2 shown in FIG. 2C with a duty ratio of about 50%. At this time, although not shown, the switching element Q4 is also turned on/off at the same timing as that of the switching element Q1, and the switching element Q3 is also turned on/off at the same timing as that of the switching element Q2. More specifically, the pair of switching elements Q1 and Q4 and the pair of switching elements Q2 and Q3 alternately perform switching operations (to be referred to as "an operation A" hereinafter).

By the operation A, a resonant voltage of several KV with respect to the ground is generated at the connection point between a primary winding N1 of the inductor L2 and the capacitor C2. In addition, the secondary winding N2 of the inductor L2 steps up the resonant voltage by N1:N2 which is a turn ratio of the primary winding N1 and the secondary winding N2. The increased resonant voltage is applied to the high-pressure discharge lamp DL as a high-pressure pulse. When dielectric breakdown between the electrodes of the lamp DL occurs due to the high-pressure pulse, the mode shifts to a low-voltage lighting mode.

On the other hand, when the dielectric breakdown between the electrodes of the lamp DL does not occur even though the operation A is repeated the number of times (e.g., 50 times) set by the control IC 40, the application of the high-pressure pulse is halted for 800 μsec to cool the lamp DL which is at high temperature due to the application of the high-pressure pulse. After the halting for 800 μsec, the operation A is repeated 50 times. When the dielectric breakdown between the electrodes of the lamp DL does not occur even though an operation (to be referred to as "an operation B" hereinafter) obtained by combining the repetition of the operation A and the halt operation is repeated for 20 second, the application of the high-pressure pulse is halted for 2 minutes to cool the lamp DL at a high temperature. After the halting for 2 minutes, the operation B is executed again. When dielectric breakdown does not occur between the electrodes of the lamp DL even though a combination (to be referred to as "an operation C" hereinafter) of the operation for repeating the operation B for 20 seconds and the halting operation for 2 minutes is repeated 30 minutes, the control IC 40 halts the lighting operation of the lamp DL.

A case in which dielectric breakdown occurs between the electrodes of the lamp DL in the start-up mode will be described below. When dielectric breakdown occurs between the electrodes of the lamp DL, a high-pressure pulse generated by the resonant circuit 5 also flows into the inductor L1 through the lamp DL. The high-pressure pulse flowing into the inductor L1 induces a current having a magnitude depending on the high-pressure pulse on the secondary winding N2 of the inductor L1. Full wave rectification of the induced current through diodes D3 and D4 provides a detection current $I_{DET}$ and the current $I_{DET}$ is input to the control IC 40, thereby allowing the control IC 40 to detect the dielectric breakdown of the lamp DL. When the control IC 40 detecting the dielectric breakdown of the lamp DL, the mode shifts to the low-voltage lighting mode described below.

(Low-Voltage Lighting Mode)

After the dielectric breakdown, the control circuit 4 controls turning on and off of the switching elements Q1 to Q4 as shown in FIGS. 3A to 3D, in order to light the lamp DL.

a) The control circuit 4 turns off the pair of switching elements Q2 and Q3 as shown in FIGS. 3B and 3C, and, at the same time, turns on the pair of switching elements Q1 and Q4 as shown in FIGS. 3A and 3D. When it is detected by the current detection resistor R2 that the load current $I_{DL}$ flowing in the lamp DL reaches a predetermined current value as shown in FIG. 3E, the control circuit 4 turns off the switching element Q4. The control circuit 4 turns off the switching element Q1 at a predetermined time after the control circuit 4 turns off the switching element Q4, thereby returning the load current $I_{DL}$ to the capacitor C5 through a path of a body diode (not shown) of the switching element Q2→the lamp DL→the inductor L1→a body diode (not shown) of the switching element Q3). Thus, energy accumulated in the inductor L1 is discharged to make the load current $I_{DL}$ zero. When a zero-cross point at which the load current $I_{DL}$ is zero is detected by the current detection resistor R2, the control circuit 4 turns on the pair of switching elements Q1 and Q4 again and repeats the same operation as described above. This operation is performed at a high frequency of about several 10 KHz. After the operation is repeated for a predetermined period of time, the following operation b) is performed. b) The control circuit 4, as shown in FIGS. 3A to 3D, turns off the pair of switching elements Q1 and Q4 and turns on the pair of switching elements Q2 and Q3, thereby inverting the direction of the load current $I_{DL}$ flowing in the lamp DL in the operation a). The control circuit 4, as shown in FIGS. 3C and 3E, turns off the switching element Q3 when it is detected by the current detection resistor R2 with a voltage converted from a current that the load current $I_{DL}$ reaches a predetermined current value. The control circuit 4 also turns off the switching element Q2 as shown in FIG. 3B when a predetermined time passes after the switching element Q3 is turned off, thereby returning the load current $I_{DL}$ to the capacitor C5 through a path of a body diode (not shown) of the switching element Q4→the inductor L1→the lamp DL→a body diode (not shown) of the switching element Q1. Hence the load current $I_{DL}$ becomes zero. When a zero-cross point at which the load current $I_{DL}$ is zero is detected by the current detection resistor R2, the control circuit 4 turns on the pair of switching elements Q2 and Q3 again and repeats the same operation as described above. This operation is performed at a high frequency of about several 10 KHz. After the operation is repeated for a predetermined period of time, the following operation a) is performed again.

The operations a) and b) may be alternately switched at a low frequency of, e.g., 100 Hz to 200 Hz. In this manner, in a low-lamp-voltage range from 0 to 60 V, that is, until the inter-electrode voltage of the lamp DL reaches a rated lighting voltage, i.e., 80 to 110 V (depending on lamps), the control is performed to increase the load current $I_{DL}$ flowing in the lamp DL thereby heating the lamp DL quickly while preventing the lamp DL from going out.

(Stable Lighting Mode)

When the lamp DL is heated and a voltage across electrodes of the lamp DL reaches approximately the rated lighting voltage, the control circuit 4 switches between on and off-states of the switching elements Q1 to Q4 as shown in FIGS. 4A to 4D. This operation will be described below.

A) The control circuit 4, as shown in FIGS. 4B and 4C, turns off the pair of switching elements Q2 and Q3 and, as shown in FIGS. 4A and 4D, turns on the pair of switching elements Q1 and Q4. When it is detected by the current detection resistor R2 that the load current $I_{DL}$ reaches a desired current value as shown in FIG. 4E, the control circuit 4 turns off the switching element Q4. When a zero-cross point at which the load current $I_{DL}$ is zero is detected by the current detection resistor R2, the control circuit 4 turns on the switching element Q4 again and repeats the same operation as described above. Thus, the load current $I_{DL}$ with a chopping-wave-shape as shown in FIG. 4E flows into the lamp DL. This operation is performed at a high frequency of about several 10 KHz. After the operation is repeated for a predetermined period of time, the following operation B) is performed.

B) The control circuit 4, as shown in FIGS. 4A to 4D, turns off the pair of switching elements Q1 and Q4 and turns on the pair of switching elements Q2 and Q3 to invert the direction of the load current $I_{DL}$ flowing in the lamp DL in the operation A). As shown in FIG. 4E, when it is detected by the current detection resistor R2 that the load current $I_{DL}$ reaches a desired current value, the control circuit 4 turns off the switching element Q3. When a zero-cross point at which the load current $I_{DL}$ is zero is detected by the current detection resistor R2, the control circuit 4 turns on the switching element Q3 again and repeats the same operation as described above. Consequently, a chopping-wave-shaped load current $I_{DL}$ having a polarity opposing the polarity obtained in the operation A) as shown in FIG. 4E flows into the lamp DL. This operation is performed at a high frequency of about several 10 KHz. After the operation is repeated for a predetermined period of time, the operation A) is performed again.

Figure 5:
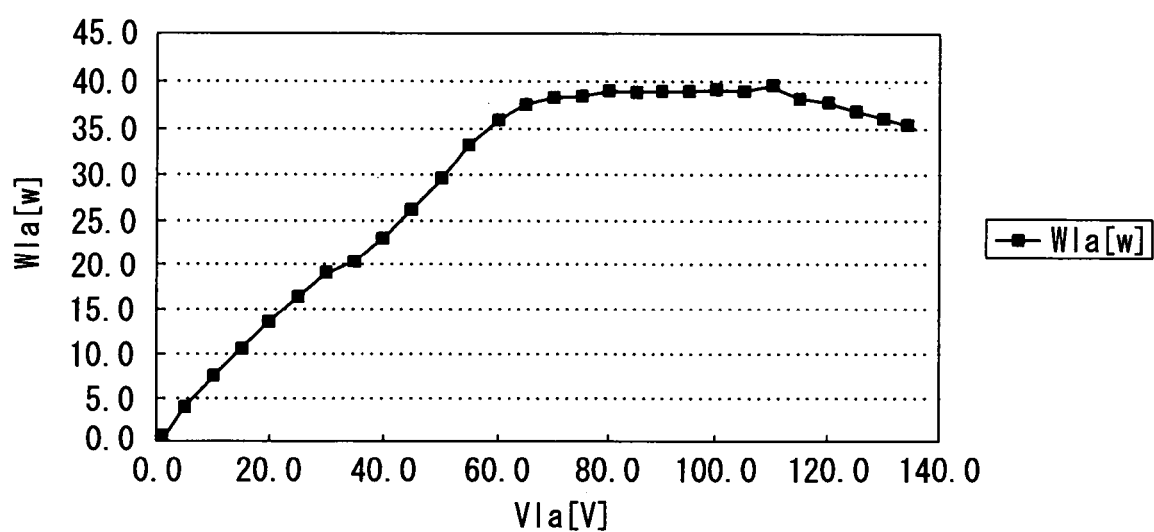
FIG. 5 is a power characteristic diagram showing basic output characteristics of a high-pressure discharge lamp.

The control circuit 4 alternately switches between the operations A) and B) at a low frequency of, e.g., 100 Hz to 200 Hz to supply a stable power to the lamp DL, thereby lighting the lamp DL stably. In the operations in the low-voltage lighting mode and the stable lighting mode, the control circuit 4 controls the power supplied to the lamp DL such that the lamp DL satisfies the relationship between a lamp power Wla and a lamp voltage Vla as shown in FIG. 5. This control allows the low-voltage lighting mode to shift to the stable lighting mode while preventing the lamp DL from going out.

Implementation of the above-described lighting operations allow the lamp DL to be started up and led to stable lighting.

In the embodiment, the resonant frequency f2 of the resonant circuit 5 is set at 360 KHz. However, the resonant frequency f2 is not limited to that value. The resonant circuit 5 may be resonated at another frequency by changing the inductive reactance and the capacitive reactance appropriately.

According to the high-pressure discharge lamp lighting device described above, since the resonant circuit 5 is resonated at a frequency which is three times the switching frequencies of the switching elements Q1 to Q4, the inductor L2 can be reduced although the resonance is performed at a high frequency. Thus the high-pressure discharge lamp lighting device can be downsized. Since the switching frequencies of the switching elements Q1 to Q4 need not be increased to the resonant frequency of the resonant circuit 5, the high voltage required for dielectric breakdown of the lamp DL can be kept at a level equal to that of a conventional lamp.

When a light fixture is provided with the high-pressure discharge lamp lighting device and a high-pressure discharge lamp which is lighted by the high-pressure discharge lamp lighting device such as a metal halide lamp, a high-pressure mercury vapor lamp, or a high-pressure sodium vapor lamp, a compact light fixture which can be installed within a small space in a power track or the like arranged on a ceiling can be provided.

Second Embodiment

Figure 6:
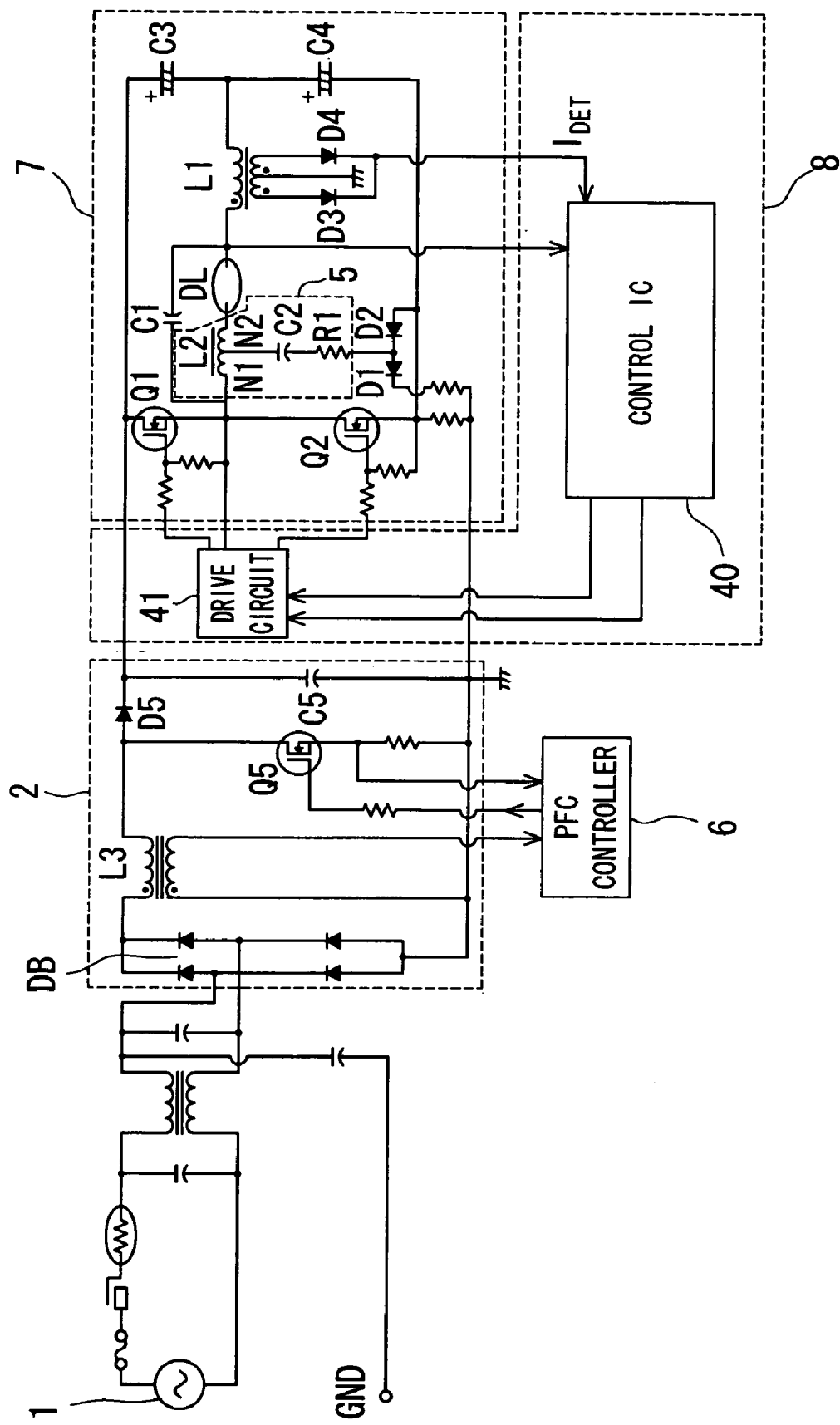
FIG. 6 is a circuit diagram in the second embodiment of the present invention.

FIG. 6 is a circuit diagram of a second embodiment of a high-pressure discharge lamp lighting device according to the present invention. The high-pressure discharge lamp lighting device according to this embodiment is different from that of the first embodiment in configurations of lighting circuit. More specifically, in the second embodiment, the switching elements Q3 and Q4 of the lighting circuit 3 in the first embodiment are replaced with capacitors C3 and C4, and the drive circuit 42 and the current detection resistor R2 of the control circuit 4 are removed.

In a lighting circuit 7 according to the embodiment, a half-bridge circuit is constituted by the switching elements Q1 and Q2 and the capacitors C3 and C4 to convert a DC power supplied from the rectifier circuit 2 into an AC power to supply the AC power to the lamp DL. Each of one terminals of the switching element Q1 and the capacitor C3 is connected to the high-potential side of the DC power supply. The other terminal of the switching element Q1 and the other terminal of the switching element Q2 are connected in series with each other. The other terminal of the capacitor C3 and one terminal of the capacitor C4 are connected in series with each other. One terminal of the switching element Q2 and the other terminal of the capacitor C4 are connected to the ground. In order to regulate a load current $I_{DL}$ flowing in the lamp DL, the inductor L1 is connected in series with the lamp DL between the connection point between the capacitors C3 and C4 and a load DL. In order to remove a ripple component of the load current $I_{DL}$ flowing in the lamp DL, a capacitor C1 is connected in parallel to the lamp DL.

The configuration of the resonant circuit 5 is the same as that of the first embodiment. The resonant circuit 5 includes an inductor L2, a capacitor C2, and a resistor R1. In the embodiment, the inductive reactance of the inductor L2 and the capacitive reactance of the capacitor C2 are set such that the resonant frequency f2 is about 240 KHz.

The control circuit 8 controls the switching elements Q1 and Q2 included in the lighting circuit to achieve a desired operation, and contains a control IC 40 and a drive circuit 41. The control IC 40 is composed of a microcomputer or the like which performs digital arithmetic processing. The drive circuit 41 is composed of a driver IC which controls the switching elements Q1 to Q2 on the basis of a control signal output from the control IC 40.

A lighting operation of the high-pressure discharge lamp lighting device according to the embodiment will be described below with reference to FIGS. 7A to 7C and FIGS. 8A to 8C. In the embodiment, as in the previous embodiment, a start-up mode, a low-voltage lighting mode, and a stable lighting mode are sequentially executed to light the lamp DL.

(Start-up Mode)

Figure 7:
FIG. 7A is a graph showing a waveform of a drive signal supplied to the switching element Q1 in the start-up mode.
FIG. 7B is a graph showing a waveform of a drive signal supplied to the switching element Q2 in the start-up mode.
FIG. 7C is a graph showing a waveform of a voltage output from the inductor L2 in the start-up mode.

In order to start up the lamp DL, a high-pressure pulse must be applied across the electrodes of the lamp DL to cause dielectric breakdown between the electrodes. In the high-pressure discharge lamp lighting device, as shown in FIG. 7C, a resonant frequency f2 for the inductor L2 and the capacitor C2 of the resonant circuit 5 is 240 KHz. As shown in FIGS. 7A and 7B, the switching elements Q1 and Q2 are alternately turned on and off at a frequency of fsw1=120 KHz which is ½ of the resonant frequency f2 with duty ratios of about 40% and 60%, respectively. The operation is repeated the number of times (50 times) set by the control IC 40 as in the first embodiment to cause dielectric breakdown between the electrodes of the lamp DL. When the dielectric breakdown of the lamp DL occurs, as in the first embodiment, the start-up mode shifts to a low-voltage lighting mode. Although thee operation in the low-voltage lighting mode in the second embodiment is basically the same as that in the first embodiment, it is different from the first embodiment in that the switching operations of the switching elements Q3 and Q4 are not performed. Thus explanation of the low-voltage lighting mode will be omitted here.

(Stable Lighting Mode)

Figure 8:
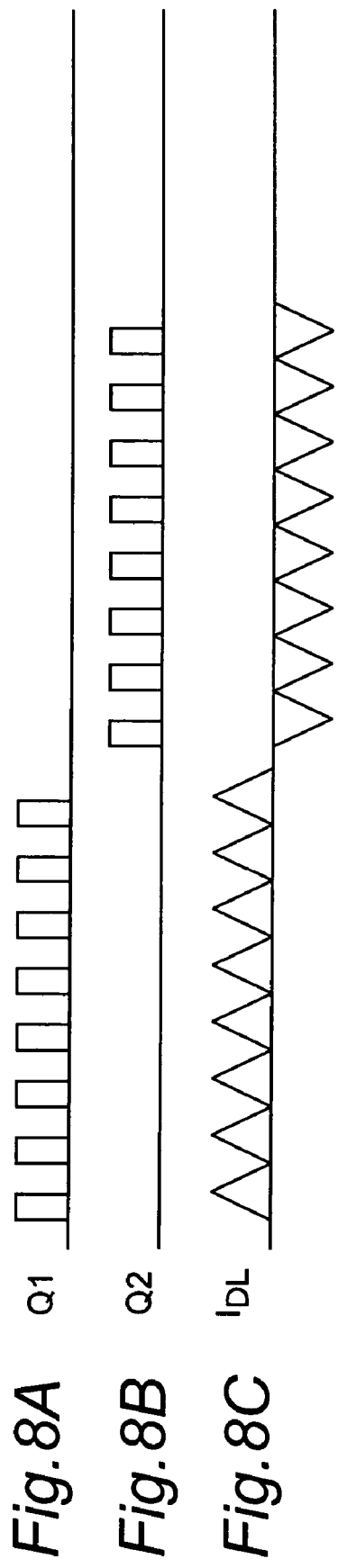
FIG. 8A is a graph showing a waveform of a drive signal supplied to the switching element Q1 in the stable lighting mode.
FIG. 8B is a graph showing a waveform of a drive signal supplied to the switching element Q2 in the stable lighting mode.
FIG. 8C is a graph showing a waveform of a current flowing in the lamp DL in the stable lighting mode.

In the stable lighting mode, the control circuit 8 performs switching control of the switching elements Q1 and Q2 as shown in FIGS. 8A and 8B. The operation will be described below.

A) The control circuit 8, as shown in FIGS. 8A and 8B, turns off the switching element Q2 and turns on the switching element Q1. After the control circuit 8 turns on the switching element Q1, when it is detected by a detection current $I_{DET}$ which is converted to a voltage that the load current $I_{DL}$ reaches a desired current value, the control circuit 8 turns off the switching element Q1. In addition, it is detected that the load current $I_{DL}$ is attenuated to zero, the control circuit 8 turns on the switching element Q1 again. Thus, a chopping-wave-shaped load current $I_{DL}$ as shown in FIG. 8C flows into the lamp DL. The operation is repeated for a predetermined period of time, the following operation B) will be performed.

B) The control circuit 8, as shown in FIGS. 8A and 8B, turns off the switching element Q1, and turns on the switching element Q2. After the switching element Q2 is turned on and after it is detected by the detection current $I_{DET}$ that the load current $I_{DL}$ reaches a desired current value, the control circuit 8 turns off the switching element Q2. When it is detected that the load current $I_{DL}$ becomes zero, the control circuit 8 turns on the switching element Q2 again. Hence, a chopping-wave-shaped lamp current $I_{DL}$ having a polarity opposing the polarity in the operation A) flows into the lamp DL as shown in FIG. 8C. After the operation is repeated for a predetermined period of time, the operation A) is performed again.

The control circuit 8 alternately performs the operations A) and B) at a low frequency of 100 Hz to 200 Hz to supply a stable power to the lamp DL. Such a lighting operation allows the lamp DL to be reliably lighted.

This embodiment, as shown in the circuit diagram in FIG. 6, is provided with the series resonant circuit composed of the inductor L2 and the capacitor C2 and the series resonant circuit composed of the inductor L1 and the capacitor C1. The inductor L1 has an inductance falling within several hundred µH to several mH to prevent an excessive current from flowing in the lamp DL during lighting of the lamp. The capacitor C1 has a capacitance falling within several hundred nF to several µF to remove a ripple component of the load current $I_{DL}$ flowing in the lamp DL during lighting of the lamp. For this reason, the resonant frequency of the series resonant circuit composed of the inductor L1 and the capacitor C1 is about several KHz. Since the resonant frequency is considerably lower than the switching frequency fsw1 in the start-up mode of the switching elements Q1 and Q2, the resonant frequency is not exerted by the switching frequency. For example, when L1 is set to 700 µH and C1 is set to 220 nF, an excessive current can be prevented from flowing in the lamp DL, and the ripple component can also be removed. Furthermore, a resonant frequency f1 of the series resonant circuit composed of the inductor L1 and the capacitor C1 is 12 KHz, and thus the resonant frequency f1 can be made considerably smaller than the switching frequency fsw1=120 KHz in the start-up mode. In order to remove the influence of the series resonant circuit composed of the inductor L1 and the capacitor C1 in a operation with no load, the resonant frequency f1 of the series resonant circuit is preferably made ½ or less of the switching frequency fsw1 in the start-up mode.

According to the high-pressure discharge lamp lighting device described above, the inductor L2 of the resonant circuit 5 which was difficult to be significantly downsized in a conventional technique can be reduced in size. In addition, since the switching frequencies of the switching elements Q1 to Q4 need not be made high, a high voltage required for dielectric breakdown of the lamp DL can be kept at a level equal to that of a conventional lamp.

Third Embodiment

Figure 9:
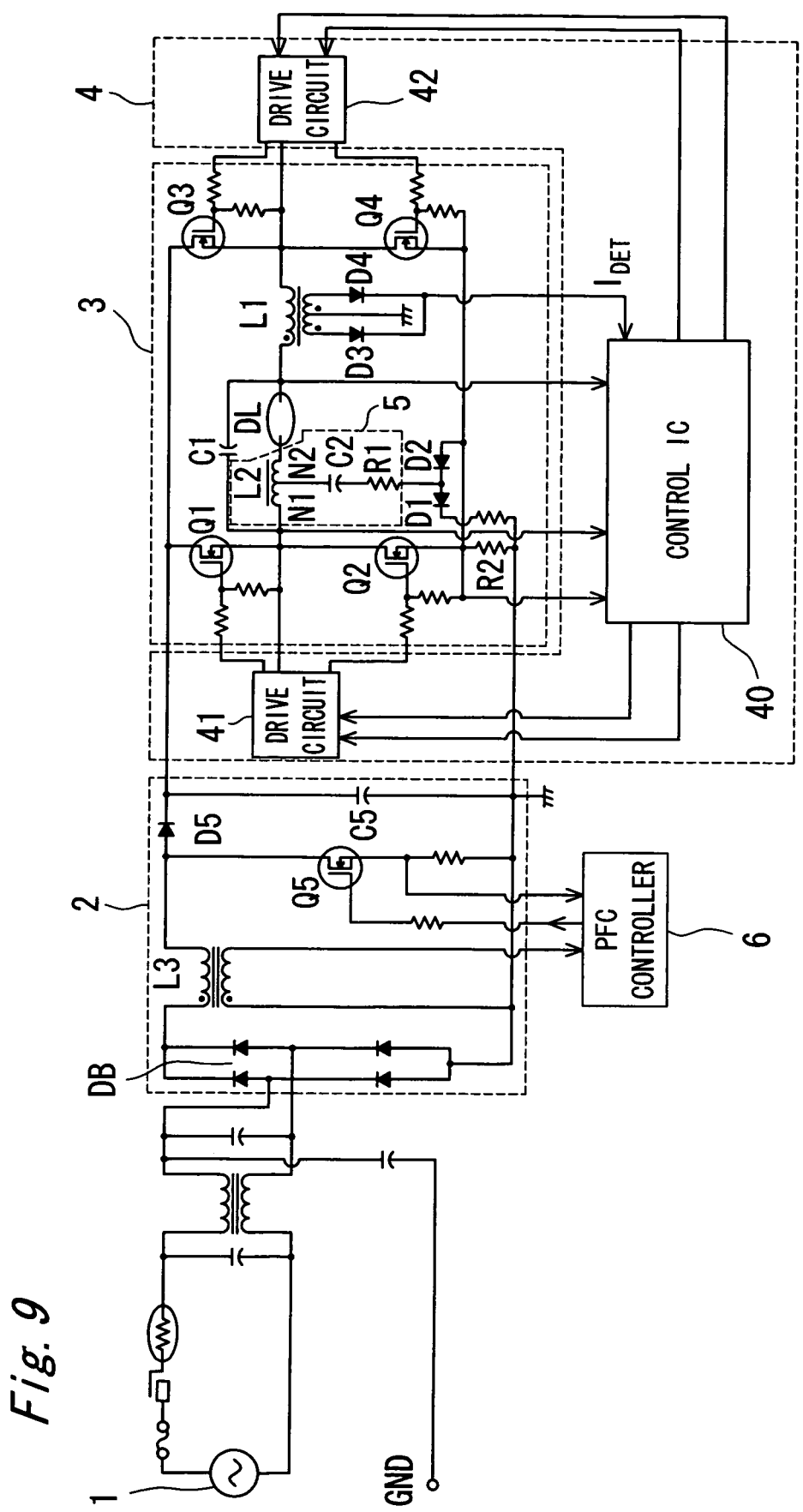
FIG. 9 is a circuit diagram in the third embodiment of the present invention.

FIG. 9 is a circuit diagram of the third embodiment of a high-pressure discharge lamp lighting device according to the present invention. The circuit configuration of the embodiment is basically the same as that of the first embodiment. The difference point is in that a voltage at a connection point between an inductor L1 and a lamp DL is input to a control IC of a control circuit 4 to make it possible to detect the voltage.

An operation of the embodiment will be described below with reference to FIGS. 10A to 10E and FIG. 11.

Figure 10:
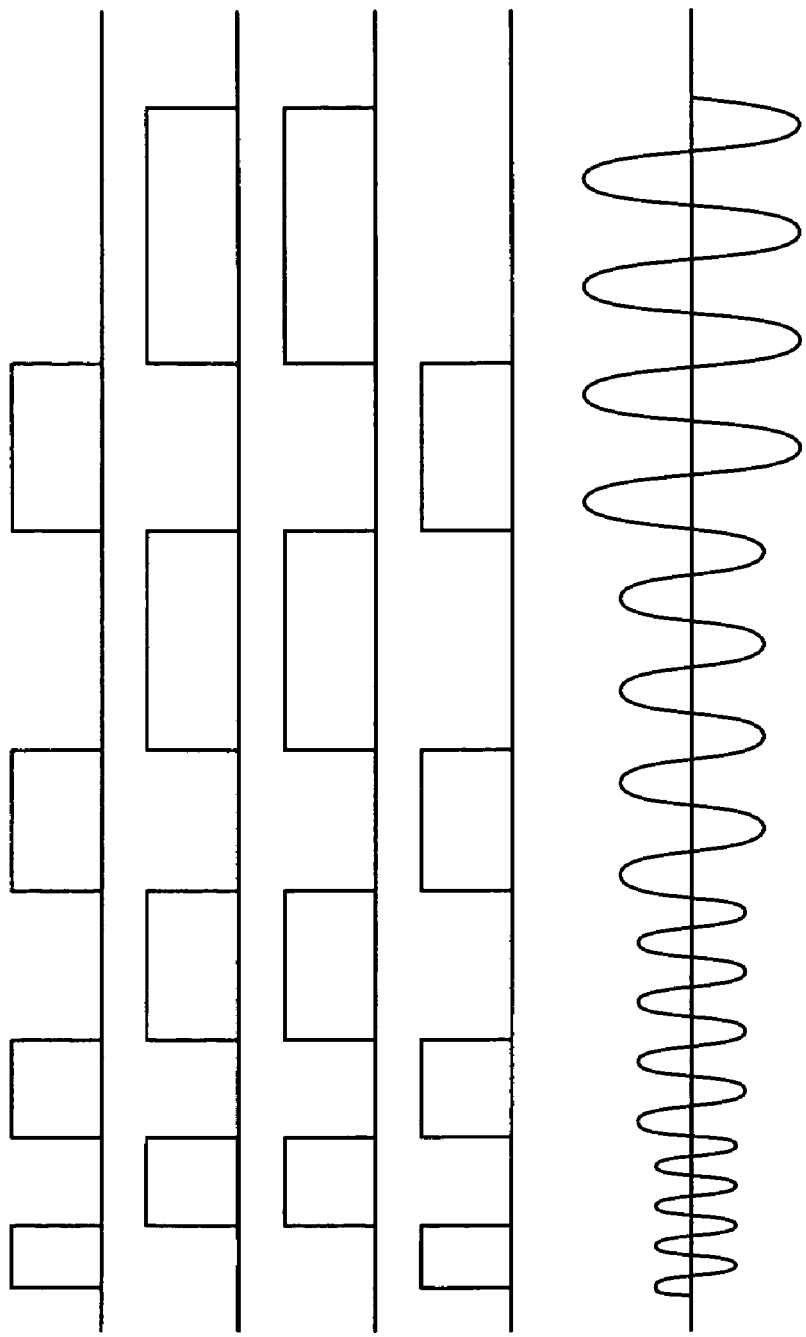
FIG. 10A is a graph showing a waveform of a drive signal supplied to the switching element Q1 in the start-up mode.
FIG. 10B is a graph showing a waveform of a drive signal supplied to the switching element Q2 in the start-up mode.
FIG. 10C is a graph showing a waveform of a drive signal supplied to the switching element Q3 in the start-up mode.
FIG. 10D is a graph showing a waveform of a drive signal supplied to the switching element Q4 in the start-up mode.
FIG. 10E is a graph showing a waveform of a voltage output from the inductor L2 in the start-up mode.

FIGS. 10A and 10D show drive signals Q1 and Q4 output from drive circuits 41 and 42 to switching elements Q1 and Q4 when the pair of switching elements Q1 and Q4 are turned on/off at a switching frequency fsw1 with an on-duty ratio of 40%. FIGS. 10B and 10C show drive signals Q2 and Q3 output from drive circuits 41 and 42 to switching elements Q2 and Q3 when the pair of switching elements Q2 and Q3 are alternately turned on/off at the switching frequency fsw1 with an on-duty ratio of 60%. FIG. 10E shows a terminal voltage $V_{N2}$ output from a secondary winding N2 of the inductor L2. Even in the embodiment, the frequency of the output terminal voltage $V_{N2}$ is an integral multiple of the switching frequency fsw1 of the drive signals Q1, Q2, Q3, and Q4.

Figure 11:
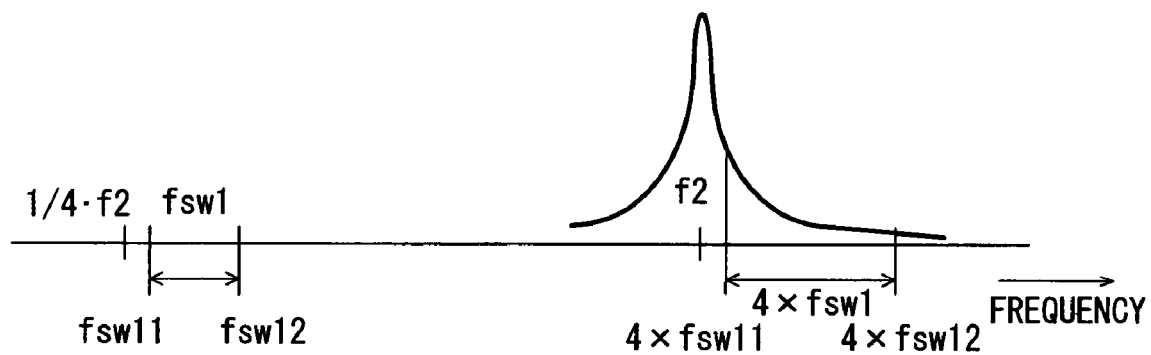
FIG. 11 is a frequency characteristic diagram showing an operation in the start-up mode.

FIG. 11 is a figure in which a variable range (fsw11 to fsw12) in which the switching frequency fsw1 is changed, a variable range (4×fsw11 to 4×fsw12) in which a frequency being four times the switching frequency can be changed depending on the change of the switching frequency fsw1, and a current flowing in a resonant circuit 5 are plotted depending on the changing frequencies.

When the pair of switching elements Q1 and Q4 are alternately turned on/off at the switching frequency fsw1 with an on-duty ratio of 40%, and when the pair of switching elements Q2 and Q3 are alternately turned on/off at the switching frequency fsw1 with an on-duty ratio of 60%, a rectangular wave voltage having an on-duty ratio of 40% and an amplitude equal to that of the DC power supply voltage (i.e., the voltage of the capacitor C5 of the rectifier circuit 2) is generated at the connection point between the switching elements Q1 and Q2. The rectangular wave includes frequency components which are 2, 3, 4, 6, . . . times the switching frequency fsw1. FIG. 11 shows a rectangular wave having a frequency which is 4 times the switching frequency fsw1.

A lower limit fsw11 of the variable range of the switching frequency fsw1 is set to be ¼ or more of the resonant frequency f2 of the resonant circuit 5, and the switching frequency fsw1 is changed from an upper limit fsw12 to the lower limit fsw11 in the variable range. In this case, the frequency of the high-pressure pulse supplied form the inductor L2 to the lamp DL changes from 4×fsw12 to 4×fsw11. As the switching frequency fsw1 is decreased by the frequency characteristics of the impedance of the resonant circuit 5, a resonant current increases depending on the decrease of the switching frequency fsw1. A high-pressure pulse having a voltage which gradually increases depending on the increase of the resonant current can be obtained. In this embodiment, although the switching frequency is changed from a high frequency to a low frequency, the switching frequency may be reversely changed.

Fourth Embodiment

Figure 12:
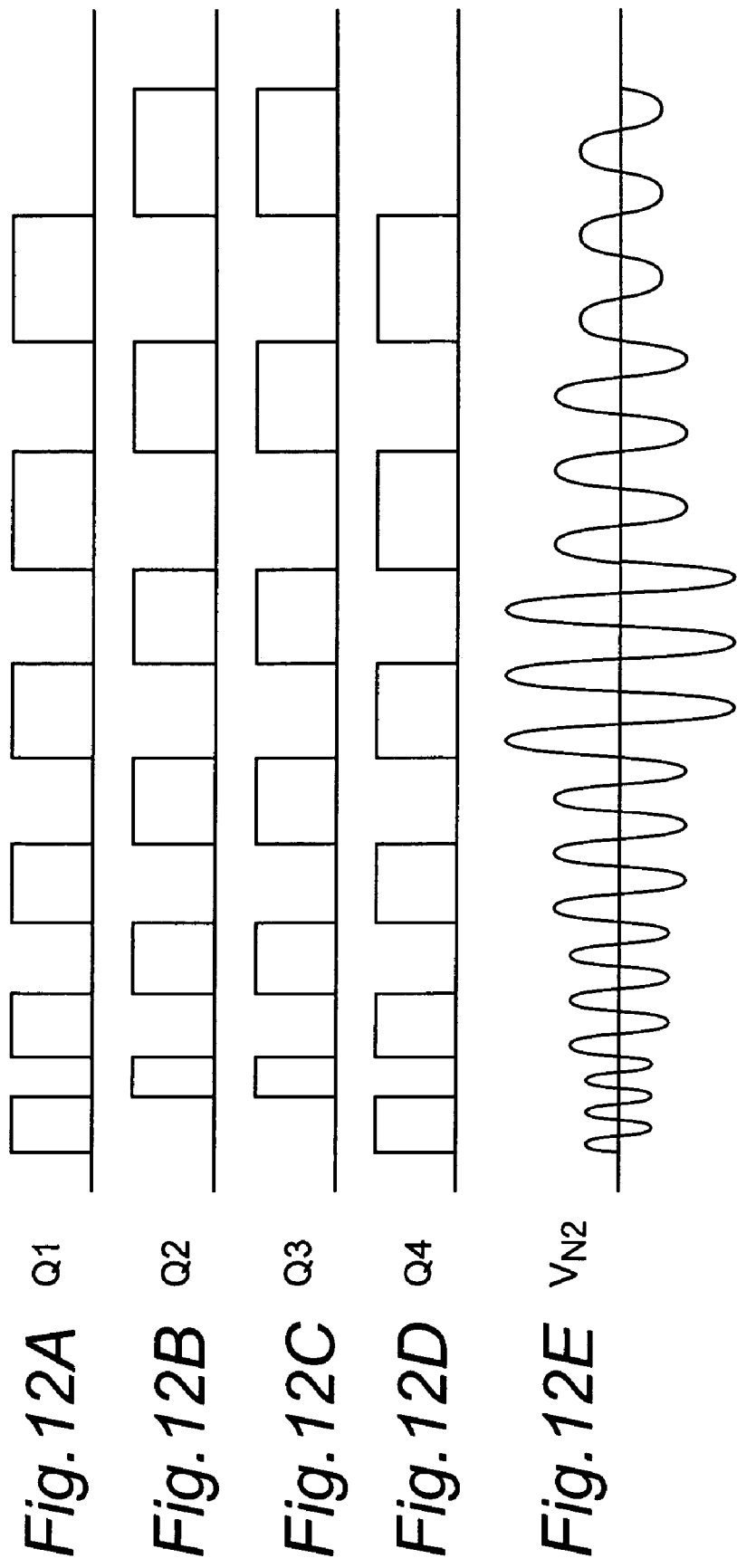
FIG. 12A is a graph showing a waveform of a drive signal applied to the switching element Q1 in the start-up mode in the fourth embodiment of the present invention.
FIG. 12B is a graph showing a waveform of a drive signal supplied to the switching element Q2 in the start-up mode.
FIG. 12C is a graph showing a waveform of a drive signal supplied to the switching element Q3 in the start-up mode.
FIG. 12D is a graph showing a waveform of a drive signal supplied to the switching element Q4 in the start-up mode.
FIG. 12E is a graph showing a waveform of a voltage output by the inductor L2 in the start-up mode.

An operation of the fourth embodiment of a high-pressure discharge lamp lighting device according to the present invention will be described below with reference to FIGS. 12 and 13. FIGS. 12A to 12E show drive signals of switching elements Q1 to Q4 and an output terminal voltage $V_{N2}$ of a secondary winding N2 of an inductor L2 when the pair of switching elements Q1 and Q4 and the pair of switching elements Q2 and Q3 are alternately turned on/off at a switching frequency fsw1 and a duty ratio of 50% in the start-up mode of the circuit shown in FIG. 1 or 9.

Figure 13:
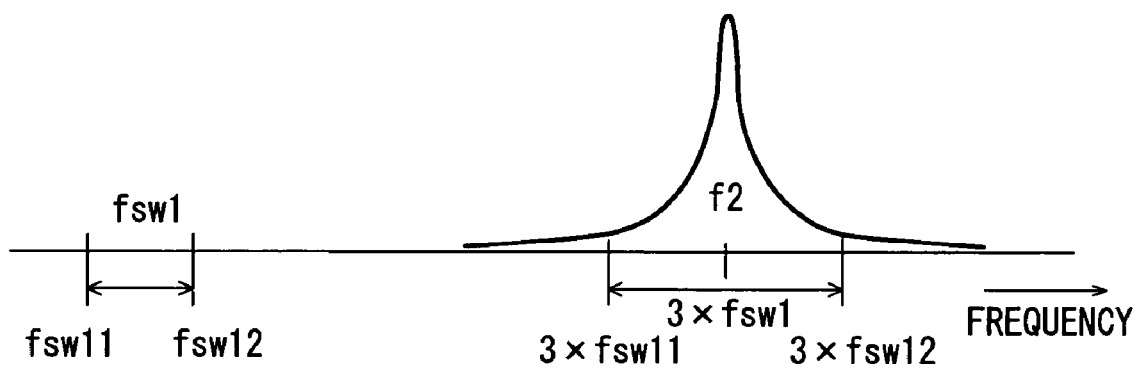
FIG. 13 is a frequency characteristic diagram showing an operation in the start-up mode.

FIG. 13 is a graph in which a variable range (fsw11 to fsw12) in which the switching frequency fsw1 is changed, a variable range (3×fsw11 to 3×fsw12) in which a frequency being three times the switching frequency can be changed depending on the change of the switching frequency fsw1, and a current flowing in a resonant circuit 5 are plotted depending on the frequency change.

When the pair of switching elements Q1 and Q4 and the pair of switching elements Q2 and Q3 are alternately turned on/off at a duty ratio of 50%, a rectangular wave voltage having a duty ratio of 50% and an amplitude equal to that of the DC power supply voltage (i.e., the voltage of the capacitor C5 of the rectifier circuit 2) is generated by the connection point between the switching elements Q1 and Q2. The rectangular wave includes frequency components which are odd-number times the frequency fsw1. The embodiment shows a rectangular wave having a frequency which is three times the switching frequency fsw1.

As shown in FIG. 13, when the switching frequency fsw1 is changed from an upper limit fsw12 to a lower limit fsw11 such that the switching frequency fsw1 includes ⅓ of the resonant frequency f2 of the resonant circuit 5, the current value of the resonant current flowing in the resonant circuit 5 increases as the frequency (3×fsw1) being three times the switching frequency approaches the resonant frequency f2 from the frequency (3×fsw12). Accordingly, the voltage of the high-pressure pulse increases. As the frequency being three times the switching frequency passes through the resonant frequency f2 and then comes close to 3×fsw11, the voltage of the resonant current flowing in the resonant circuit 5 decreases. A high-pressure pulse of which voltage decreases as the decrease of the voltage of the resonant current can be obtained. The lower limit fsw11 and the upper limit fsw12 which both the ends of the variable range of the switching frequency fsw1 may be preferably set at a value at which a stable high-pressure pulse can be achieved even though the resonant frequency of the resonant circuit 5 changes due to fluctuations of the characteristics of the parts composing the resonant circuit 5 or the stray capacitance of an output line extending from the high-pressure discharge lamp lighting device to the lamp. In the embodiment, the case in which the high-pressure pulse is generated at a frequency being three times the switching frequency fsw1 has been described above. However, the voltage-pulse may be generated at a frequency being odd-number (five or more) times the switching frequency fsw1.

Figure 14:
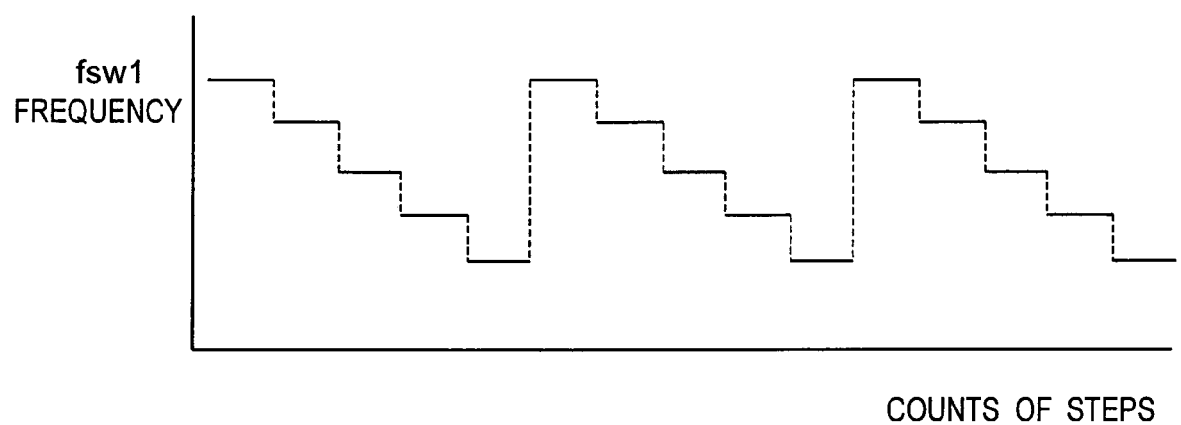
FIG. 14 is a diagram for explaining a frequency varying operation using a microcomputer.

As means for changing the switching frequency fsw1, a microcomputer operable to perform digital arithmetic processing or an analog IC such as an ASIC (Application Specific Integrated Circuit) operable to perform analog arithmetic processing can be used. For example, when a microcomputer is used, as shown in FIG. 14, the switching frequency fsw1 can be discretely and stepwise changed. The switching frequency fsw1 can not only be changed in one direction from high frequency to low frequency but also be increased from the middle point again, and time of frequency change can be freely controlled. On the other hand, when the switching frequency fsw1 is changed by using the analog IC, the frequency can be changed not stepwise but continuously, thereby providing more exactly control of the frequency.

Fifth Embodiment

Figure 15:
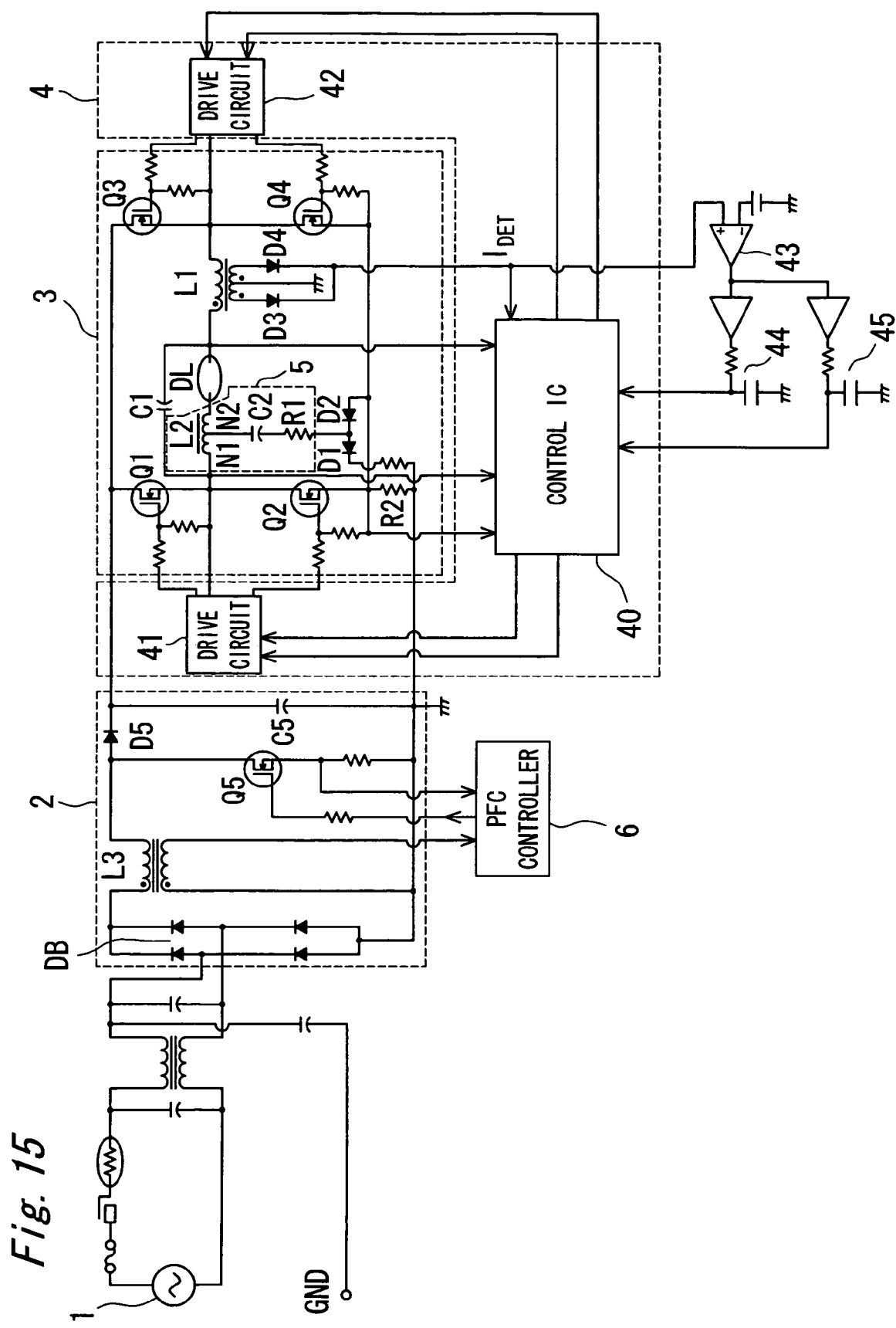
FIG. 15 is a circuit diagram in the fifth embodiment of the present invention.

The fifth embodiment of a high-pressure discharge lamp lighting device according to the present invention will be described below. As shown in FIG. 15, in the embodiment, a control IC 40 is designed to be able to change switching time from a start-up mode to a low-voltage lighting mode depending on a detection current $I_{DET}$ from a secondary winding provided in the inductor L1.

When the detection current $I_{DET}$ from the secondary winding of the inductor L1 exceeds a predetermined value, a comparator 43 outputs a signal representing that a lamp DL is lighted. The output signal is transmitted to the control IC 40 by a low-voltage lighting mode switching circuit 44 connected to the output section of the comparator 43 when a predetermined period of time elapses. When the control IC 40 receives the signal output from the comparator 43, the control IC 40 switches the operation mode from the start-up mode to the low-voltage lighting mode. The switching time can be controlled by changing the resistance of a resistor and/or the capacitance of a capacitor in the low-voltage lighting mode switching circuit 44. In this manner, the mode can be switched to the low-voltage lighting mode when a predetermined period of time elapses after the lamp DL is started.

A stable lighting mode switching circuit 45 is connected to the output section of the comparator 43 so that the mode shifts to a stable lighting mode when a predetermined period of time elapses after a voltage across the electrodes of the lamp DL rises to a value almost equal to a rated lighting voltage. The shift time to the stable lighting mode can also be controlled by changing the resistance of the resistor and/or the capacitance of the capacitor in the stable lighting mode switching circuit 45. Means for detecting the lighting state of the lamp DL is not limited to the detection current $I_{DET}$ of the second winding of the inductance L1, but any means which can detect the lighting state of the lamp DL may be used.

Sixth Embodiment

Figure 16:
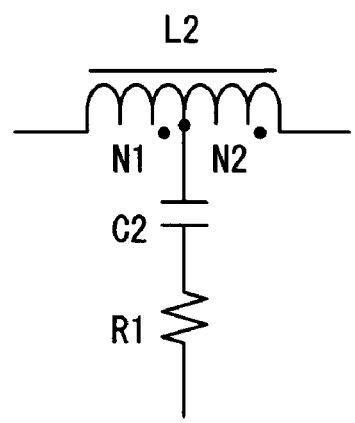
FIG. 16 is a circuit diagram showing a modification of a resonant circuit.
Figure 17:
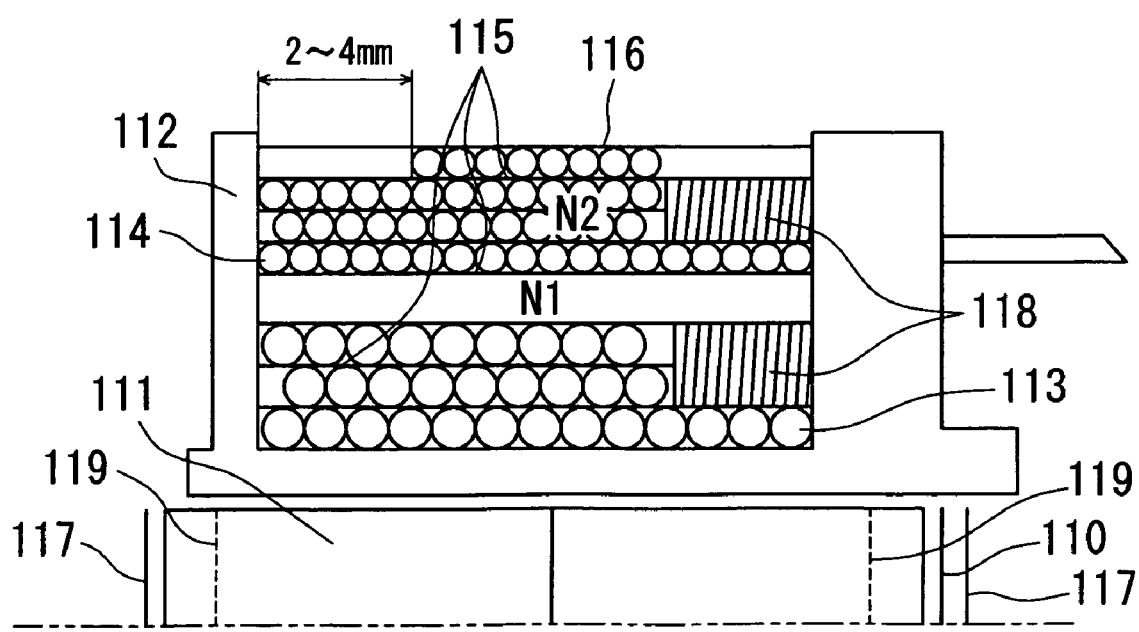
FIG. 17 is a diagram showing a transformer structure in the resonant circuit of the modification.
Figure 18:
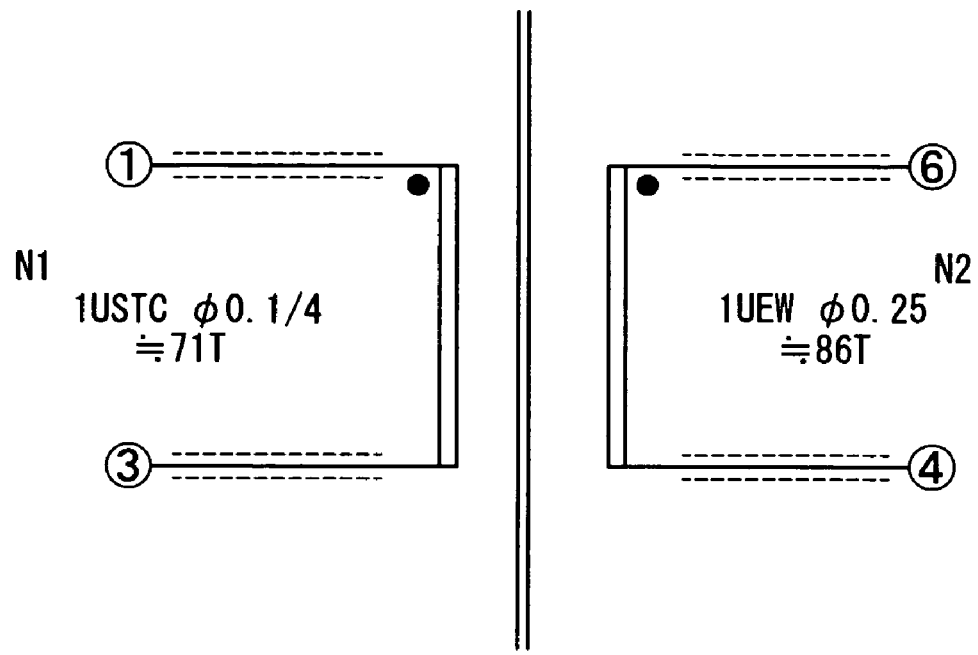
FIG. 18 is a circuit diagram of a transformer in the resonant circuit of the modification.

FIG. 16 shows a modification of a resonant circuit 5 used in the high-pressure discharge lamp lighting device according to the above embodiment is shown in FIG. 16. FIGS. 17 and 18 are a structural diagram and a schematic of a resonant circuit 5, respectively. In the resonant circuit 5, an inductor L2 employs a transformer structure as shown in FIG. 17, and a capacitor C2 is connected to an intermediate point between a primary winding N1 having a number of turns N1 and a secondary winding N2 having a number of turns N2. By using the resonant circuit 5, a high-pressure pulse for starting up the lamp DL can be made a voltage being (N1+N2)/N1 times a voltage generated by the connection point between the primary winding N1 and the secondary winding N2 in a transformer L2, and a high-pressure pulse having the higher voltage can be generated.

A case in which a turn ratio of the primary winding and the secondary winding in the transformer L2 is given by 1:N (N>1) is considered here. In order to supply a high-pressure pulse having a voltage Vo to the lamp DL, as a resonant voltage of the resonant circuit 5, a voltage Vo/2 must be generated when the turn ratio is 1:1, or a voltage Vo/(N+1) must be generated when the turn ratio is 1:N (N>1). In this case, since N>1 is satisfied, when the turn ratio is given by 1:N (N>1), a resonant voltage to be generated may be low, and the resonant current can be reduced like the resonant voltage. Therefore, a value of a current flowing in the resonant circuit 5 may be small, and a compact capacitor having a small capacitance can be used.

The structure of the transformer L2 is shown in FIG. 17, and includes a copper wire 113 serving as the primary winding N1, a copper wire 114 serving as a secondary winding, a core 111 on which the copper wire 113 and the copper wire 114 are wound, a bobbin 112 which supports the core 111, a protecting tape 110, a coil interlayer tape 115 which insulates layers of wound copper wires from each other, a coil tape 116, a core tape 117, a creepage surface tape 118, and a protecting tape 119.

Figure 19:
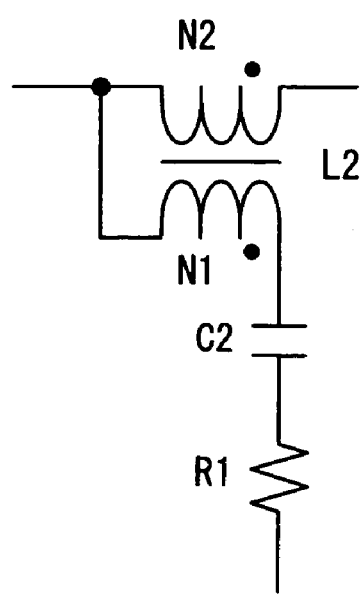
FIG. 19 is a circuit diagram showing another modification of the resonant circuit.

FIG. 19 shows another modification of the resonant circuit 5. This resonant circuit 5 is designated so that the connection point between the primary winding N1 and the secondary winding N2 in the transformer L2 can be connected to the connection point between the switching elements Q1 and Q2. With this configuration, for example, when a high-pressure pulse having a voltage Vo is supplied to the output terminal of the secondary winding N2 of the transformer L2, it is enough that the resonant circuit 5 generates only a resonant voltage being 1/N times the voltage Vo of the high-pressure pulse.

The resonant frequency of the resonant circuit 5 is determined by a series resonant circuit composed of the primary winding N1, the capacitor C2, and a resistor R1 in the transformer. L2. Since in fact a stray capacitance is generated on a connection line for connecting the transformer L2 and the lamp DL, the resonant frequency may be changed due to the influence of the stray capacitance. Furthermore, in the resonant circuit 5, one terminal of the capacitor C2 is connected to the connection point between the primary winding N1 and the secondary winding N2 in the transformer L2, and the resistor R1 is connected to the other terminal of the capacitor C2. However, even though the capacitor C2 and the resistor R1 are reversely connected, electric characteristics do not change. Thus, the capacitor C2 and the resistor R1 may be reversely connected.

Seventh Embodiment

The seventh embodiment of a high-pressure discharge lamp lighting device according to the present invention will be described below. In the high-pressure discharge lamp lighting device composed of the circuit shown in FIG. 1, a resonant frequency of a resonant circuit 5 is set at 400 KHz, and a primary-side inductance of a transformer L2 at this time is set at 430 µH. A primary winding N1 of the transformer L2 is constituted by a litz wire, and the secondary winding N2 is constituted by a single wire. In case that the core of the transformer is given by EE-19.4 and that characteristics when the primary winding N1 is constituted by a single wire and characteristics when the primary winding N1 is constituted by a litz wire are compared with each other, the comparison result is obtained as shown in Tables 1 to 3.

TABLE 1

Inductance of Transformer

| Winding | | L1 (µH) | | L1 + L2 (µH) | |
|---|---|---|---|---|---|
| N1 | N2 | 100 kHz | 400 kHz | 100 kHz | 400 kHz |
| Single Wire | Single Wire | 386.2 | 434.7 | 1950 | 2240 |
| Litz Wire | Single Wire | 375.7 | 426.0 | 1890 | 2200 |

TABLE 2

Resistance of Primary Winding

| Winding | | Resistance (Ω) | | |
|---|---|---|---|---|
| N1 | N2 | DC | 100 kHz | 400 kHz |
| Single Wire | Single Wire | 0.87 | 1.91 | 21.4 |
| Litz Wire | Single Wire | 1.48 | 1.75 | 10.3 |

TABLE 3

Resistance of Primary Winding and Secondary Winding

| Winding | | Resistance (Ω) | | |
|---|---|---|---|---|
| N1 | N2 | DC | 100 kHz | 400 kHz |
| Single Wire | Single Wire | 2.14 | 10.1 | 155.4 |
| Litz Wire | Single Wire | 2.81 | 4.98 | 66.1 |

In application of a DC bias, the resistance of the primary winding N1 with the single wire is smaller than that with the litz wire. However, at the resonant frequency, the resistance of the primary winding N1 with the litz wire is smaller than that with the single wire. The high-pressure pulse for lighting the lamp DL must have a high voltage of 1 KV or more, and thus a resistance component at the resonant frequency must be set as low as possible. In contrast to this, a current flowing in the transformer L2 while the lamp DL is lighted has a waveform formed by superposing a high-frequency ripple on a rectangular wave with a frequency of several 100 Hz or less. Accordingly, if the resistance component in application of a DC bias is not small, heat generated by the transformer L2 increases.

In general, when comparing a single wire and a litz wire which are equal to each other in diameter, the conductive sectional area of the single wire is larger than that of the litz wire, and the surface area of the litz wire is larger than that of the single wire. Since the resonant circuit includes the primary winding N1 of the transformer L2, it is only necessary that the resistance during the resonance is reduced in only the primary winding N1. After the lamp DL is lighted, it is only necessary that the secondary winding N2 in which a current flows has a small resistance value at a low frequency. Therefore, with this configuration, both stable generation of a high-pressure pulse having a high voltage and suppression of heat generation in a lighting state of the high-pressure discharge lamp can be simultaneously realized.

Eighth Embodiment

The eighth embodiment of a high-pressure discharge lamp lighting device according to the present invention will be described below with reference to FIG. 20.

In this and the following embodiments, description is made to arts for realizing miniaturization on mounting electronic parts composing the high-pressure discharge lamp lighting device described in the above embodiments on a printed circuit board. Combination of the arts described in first to seventh embodiments, and the arts in this and the following embodiments can realize further miniaturization of a lighting device.

Figure 20:
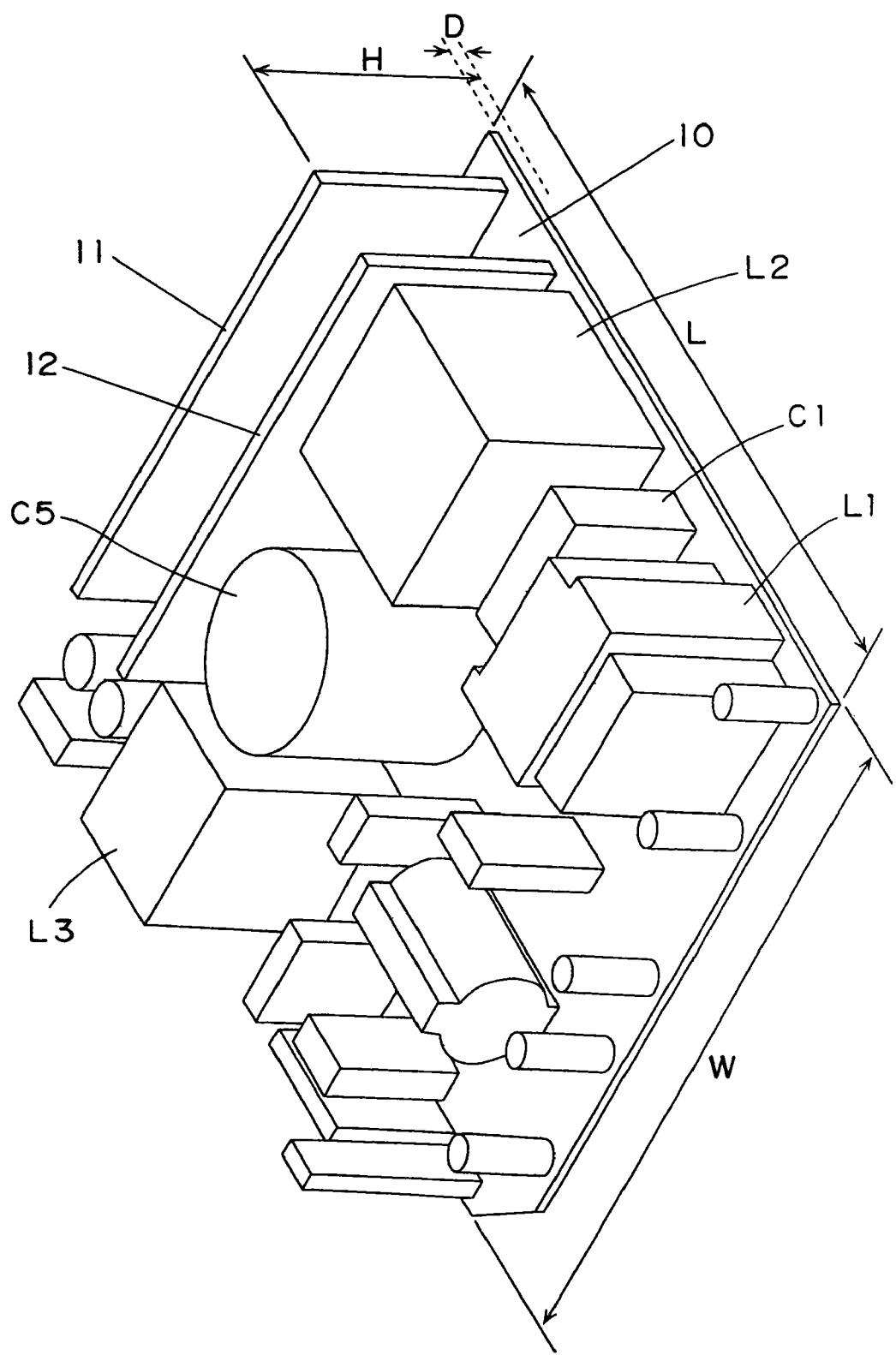
FIG. 20 is a perspective view showing an appearance of the sixth embodiment of the present invention.

FIG. 20 shows one example of mounting of the electronic parts constituting the circuits shown in FIGS. 1, 6, and the like. The electronic parts are dispersedly mounted on a main circuit board 10, a first auxiliary circuit board 11, and a second auxiliary circuit board 12. As shown in FIG. 20, the first auxiliary circuit board 11 and the second auxiliary circuit board 12 are vertically arranged perpendicularly to the main circuit board 10 with a predetermined interval. Of the electronic parts of the circuit shown in FIG. 1 or the like, an inductor L1, a capacitor C1, an inductor L2, an inductor L3, a capacitor C5, and a capacitor C2 (not shown) are mounted on the main circuit board 10, a control IC 40, a power factor correction controller 6, and a bridge rectifier DB are mounted on the first auxiliary circuit board 11, and switching elements Q1 to Q4 and drive circuits 41 and 42 are mounted on the second auxiliary circuit board 12.

This arrangement is made in consideration of mutual influence between heats generated by the electronic parts, in which semiconductor parts such as the switching elements Q1 to Q4 which should be avoided from the influence of heat are dispersedly mounted on the first auxiliary circuit boards 11 and 12 and a register, a choke coil and the like having a relatively large heat value are mounted on the main circuit board 10. In addition, when noise must be considered, the electronic parts may be mounted by appropriately changing the arrangement of the electronic parts.

The lighting device can preferably light a lamp DL having a power consumption of about 20 to 40 W, in which all the electronic parts of the high-pressure discharge lamp lighting device are mounted on the main circuit board 10 having a width W=70 mm and a length L=77 mm.

The embodiment, in particular, has a structure in which the auxiliary circuit boards 11 and 12 which are elements to regulate the height and evil effects in small-size mounting can be directly inserted in and connected to the parts surface of the main circuit board 10. Thus, a lighting device can be reduced in height. In this mounting structure, parts leads projecting from the lower solder surface of the main circuit board 10 are managed in a space extending from the lower surface of the substrate with D=3 mm. A height H from the highest part to the level having the distance (D=3 mm) from the lower surface of the substrate is made 26 mm or less.

In this manner, the semiconductor parts which must be avoided from influence of heat are mounted on the auxiliary circuit boards 11 and 12. The auxiliary circuit boards 11 and 12 are arranged at the periphery of the main circuit board 10 to avoid heat-radiating parts which generate large heat such as a resistor and a choke coil, so that the semiconductor parts can be suppressed from being thermally affected.

Figure 21A:
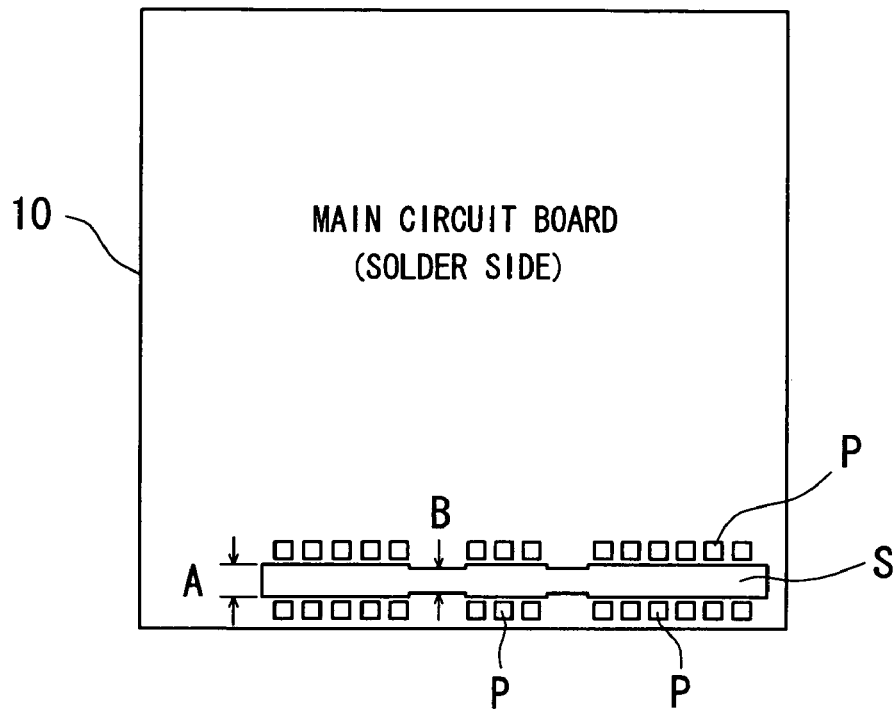
FIG. 21A is a front view of a main circuit board when viewed from a solder surface side.
Figure 21B:
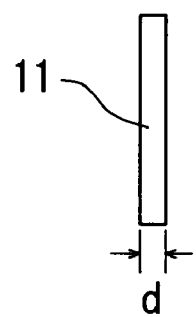
FIG. 21B is a side view of an auxiliary circuit board.
Figure 21C:
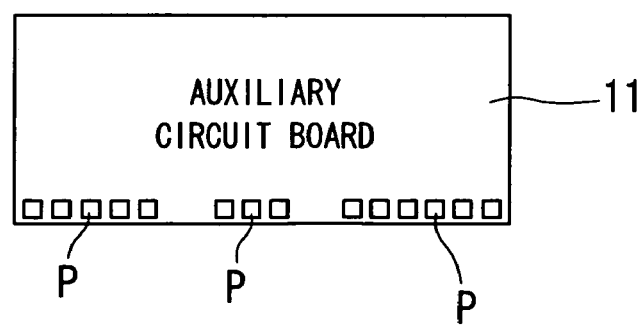
FIG. 21C is a front view of the auxiliary circuit board.

FIGS. 21A to 21C are diagrams showing connection portion between the auxiliary circuit board 11 and the main circuit board 10. As shown in FIG. 21A, a slit S which entirely penetrates the main circuit board 10 in the direction of thickness and into which the auxiliary circuit board is inserted is formed in the main circuit board 10. In the slit S, a portion having a second slit width B which is almost equal to the thickness d of the auxiliary circuit board 11 shown in FIG. 21 and a portion having a first slit width A which is larger than the second slit width B are formed. Two portions each having the second slit width B are formed to sandwich the portion having the first slot width A and located at the center in the slit S. When the auxiliary circuit board 11 is inserted into the slit S, the auxiliary circuit board 11 can be held perpendicularly to the main circuit board 10. A plurality of terminal pads P to be soldered with terminal pads P formed on the auxiliary circuit board 11 are formed near the portion having the first slit width A in a solder surface (not a surface on which parts are arranged) of the main circuit board 10. In this manner, the plurality of terminal pads P are formed near not the portion having the second slit width B but the portion having the first slit width A, and therefore the terminal pads P on the auxiliary circuit board 11 side can be prevented from being damaged by the main circuit board 10 when the auxiliary circuit board 11 is inserted into the main circuit board 10.

FIG. 21C shows the terminal pads P formed on one surface of the auxiliary circuit board 11. However, a plurality of terminal pads are aligned on the opposite surface. The terminal pads P are arranged on the lower end side to be inserted into the main circuit board 10.

In connecting the auxiliary circuit board to the main circuit board 10, the auxiliary circuit board 11 is inserted into the slit S such that the terminal pads P at the lower part of the auxiliary circuit board 11 project toward the solder surface of the main circuit board 10. In this manner, the portions each having the second slit width B tightly hold the inserted auxiliary circuit board 11 therebetween to fix the auxiliary circuit board 11. When the main circuit board 10 is dipped into a solder tank while the auxiliary circuit board 11 is held between the portions each having the second slit width B, the auxiliary circuit board 11 is soldered on the main circuit board 10 to connect the auxiliary circuit board 11 and the main circuit board 10 to each other.

The slit S having the shape shown in FIG. 21A is formed in the main circuit board 10. This arrangement allows the auxiliary circuit board 11 to be directly inserted into the main circuit board 10 to connect the main circuit board 10 with the auxiliary circuit board 11 to each other. Further this allows the solder to be prevented from being sucked up to the parts surface of the main circuit board 10, since soldering between the auxiliary circuit board 11 and the main circuit board 10 is formed on the solder surface of the main circuit board 10. Hence, the electronic parts mounted on the auxiliary circuit board 11 can be arranged at a position which is almost close to the parts surface of the main circuit board 10, so that the high-pressure discharge lamp lighting device can be further reduced in size. Further in the soldering step, the structure obtained by fixing the auxiliary circuit board 11 to the main circuit board 10 can be directly flowed in the solder tank without a large-scale jig or the like for holding the auxiliary circuit board 11 perpendicular to the main circuit board 10. Therefore, advantages of being able to simplify the manufacturing steps and to assist to reduce the cost can be achieved. In addition, soldering between the main circuit board 10 and the auxiliary circuit board 11 and soldering of the lead terminals of the electronic parts mounted on the main circuit board 10 can be simultaneously performed in the step of flowing the structure in the solder tank. Thus, the soldering step can be further simplified.

In the embodiment, the portion having the second slit width B has a width almost equal to the thickness d of the auxiliary circuit board 11. However, the portion may have a width smaller than the thickness d of the auxiliary circuit board 11. Although the two portions each having the second slit width B are formed in the slit S, only one portion having the second slit width B or three or more portions each having the second slit width B may be formed. When the plurality of portions are formed, the auxiliary circuit board 11 is held between the plurality of portions of the main circuit board 10. Hence, the auxiliary circuit board 11 can be more stably held, and stress on the soldered portion between the auxiliary circuit board 11 and the main circuit board 10 can be distributed. In addition, positions where the portions each having the second slit width B are not limited to the central of the slit S, and the portions may be formed at only both the ends or one end of the slit S. However, it is preferable that the portions each having the second slit width B are formed at positions to support the auxiliary circuit board in the intermediate part of the auxiliary circuit board in the longitudinal direction. When the portions are formed at such positions, the portions which support the auxiliary circuit board against stress such as vibration can make the holding force (stress distribution) uniform in the longitudinal direction of the auxiliary circuit board, and the stress such as vibration can be uniformly absorbed. Hence, solder joint portion can be formed on only the lower surface (one surface) of the main circuit board.

Ninth Embodiment

The ninth embodiment of a high-pressure discharge lamp lighting device according to the present invention will be described below with reference to FIGS. 22A to 24B.

In this embodiment, projecting portions are formed in a space between terminal pads P formed on the lower part of the auxiliary circuit board 11 and the electronic parts (not shown) mounted on the auxiliary circuit board 11. The projecting portions are formed on both the upper and lower surfaces of the auxiliary circuit board 11. The projecting portions are brought into contact with the mounting surface of the main circuit board 10 when the auxiliary circuit board 11 is inserted into the main circuit board 10, so that the auxiliary circuit board 11 is fixed with a predetermined height when inserting the auxiliary circuit board 11 into the main circuit board 10. Since the projecting portions are formed on both the upper and lower surfaces, when the auxiliary circuit board 11 is inserted into the main circuit board 10 such that the projecting portions on both the upper and lower surfaces are brought into contact with the main circuit board 10, the auxiliary circuit board 11 can be fixed to the main circuit board 10 almost perpendicularly to the main circuit board 10.

Figure 22A:
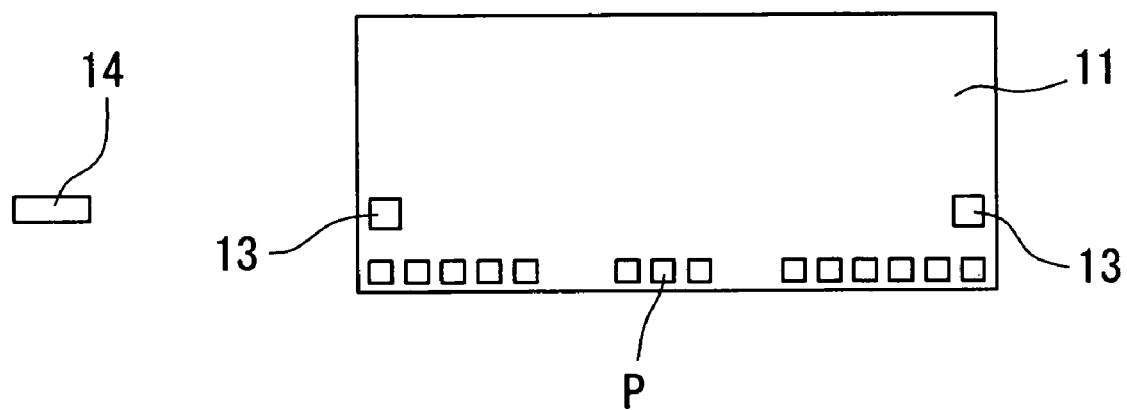
FIG. 22A is a front view of the auxiliary circuit board in the seventh embodiment of the present invention.
Figure 22B:
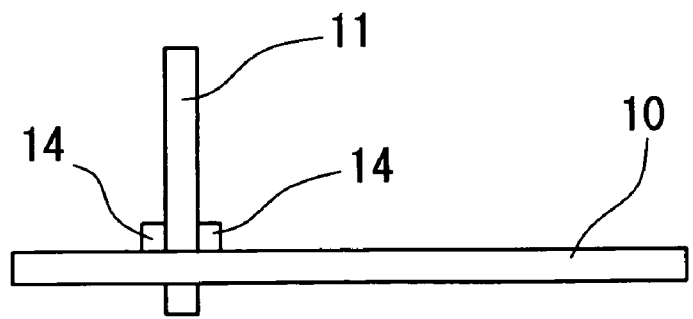
FIG. 22B is a side view of a state in which the auxiliary circuit board is inserted into the main circuit board.

In a structure shown in FIG. 22A, a hole 13 penetrating both the upper and lower surfaces of the auxiliary circuit board 11 is formed in a space between the terminal pads P formed on the lower part of the auxiliary circuit board 11 and the electronic parts mounted on the auxiliary circuit board. Insertion of a perpendicular holding rod 14 (having a length determined such that the rod 14 is not brought into contact with parts adjacent to the auxiliary circuit board 11 on the main circuit board 10) into the hole 13 makes projecting portions. The shape of the perpendicular holding rod 14 are not limited to a specific shape. However, when the perpendicular holding rod 14 is loosely fitted in the hole 13, the perpendicular holding rod 14 may be removed from the hole 13. For this reason, the hole 13 and the perpendicular holding rod 14 preferably have the same sectional shape and almost equal sectional areas. In a structure shown in FIG. 22A, the section of the hole 13 is square, and the perpendicular holding rod 14 is a rectangular solid having the same sectional area as the hole 13. However, the perpendicular holding rod 14 to be inserted into the square hole 13 may be a cylindrical body having a diameter equal to the length of one side of the hole 13. When the hole 13 and the perpendicular holding rod 14 are combined to each other, only a simple configuration which forms the hole 13 in the auxiliary circuit board 11 and prepares the perpendicular holding rod 14 matched with the hole 14 just have to be required. For this reason, the auxiliary circuit board 11 can be held perpendicularly to the main circuit board 10 without cumbersome labor, as shown in FIG. 22B.

Figure 23A:
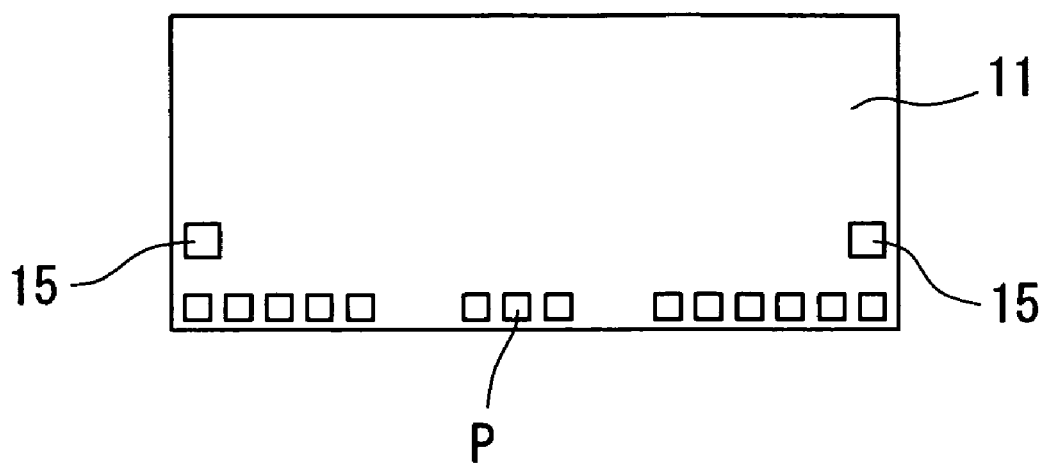
FIG. 23A is a front view showing the auxiliary circuit board having other projecting portions.
Figure 23B:
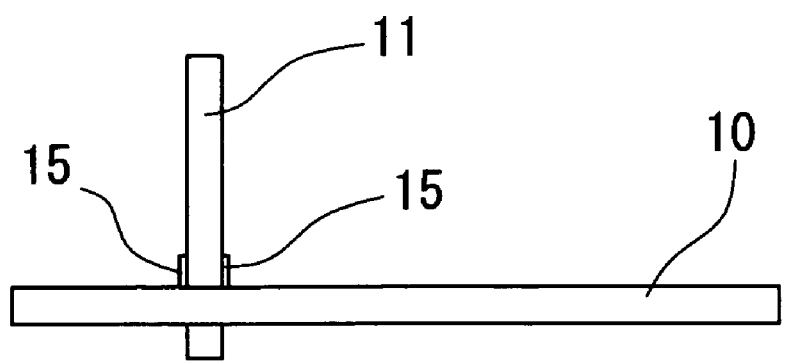
FIG. 23B is a side view showing a state in which the auxiliary circuit board having the other projecting portions is inserted into the main circuit board.

As another modification of a projecting portion, as shown in FIG. 223A, a projecting portion 15 which is in contact with the upper surface of the main circuit board 10 is formed on the lower part of the auxiliary circuit board 11. The projecting portion 15 is made of a member having a small thickness and stuck on the upper surface of the auxiliary circuit board 11. The projecting portion 15 is arranged below any electronic parts mounted on the both surfaces of the auxiliary circuit board 11 and above the terminal pads P. The projecting portion 15, as shown in FIG. 23B, can fix the auxiliary circuit board 11 to the main circuit board 10 perpendicularly to the main circuit board 10 until a soldering process is finished. The projecting portion 15 is not limited to the structure made by sticking the member having a small thickness on the upper surface of the auxiliary circuit board 11. For example, the projecting portion. 15 may be formed in such a way that a portion except for the projecting portion 15 on the upper surface of the auxiliary circuit board 11 is dug. In short, the projecting portion 15 may be formed to project from the upper surface of the auxiliary circuit board 11 with respect to the other portion.

Figure 24A:
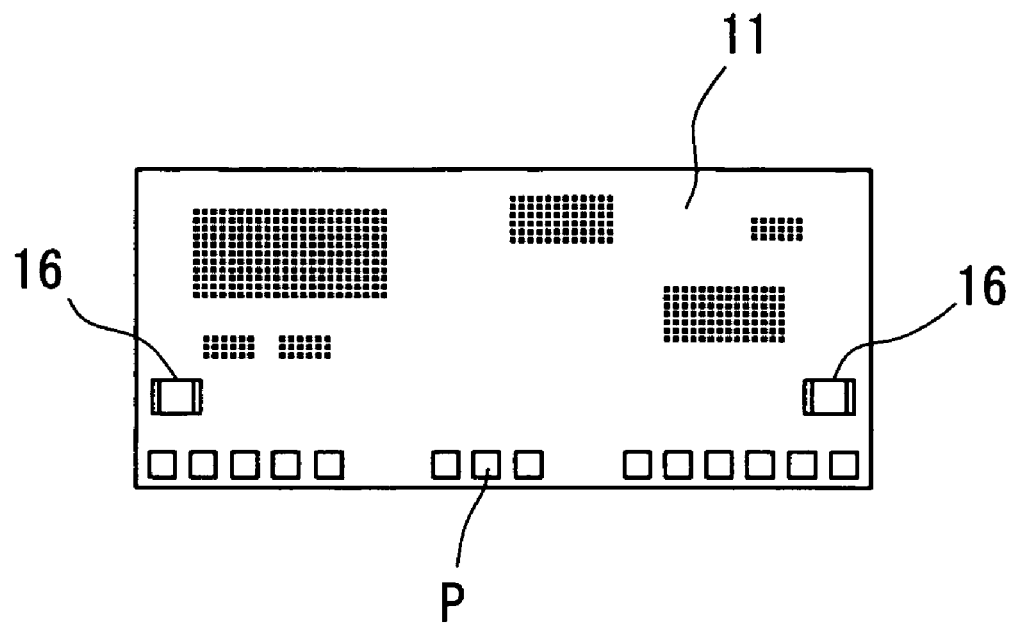
FIG. 24A is a front view of the auxiliary circuit board having still other projecting portions.
Figure 24B:
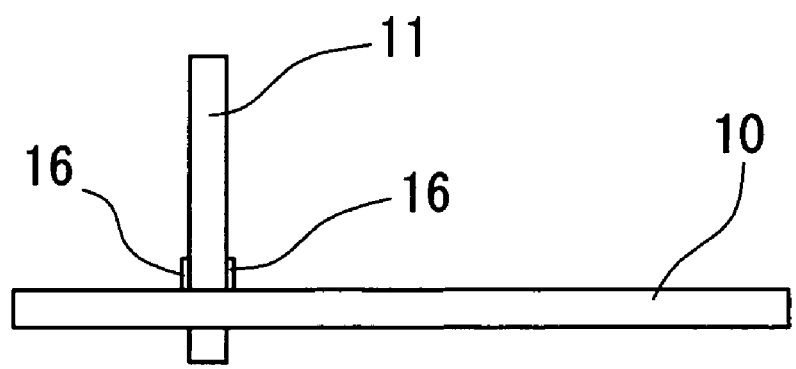
FIG. 24B is a side view showing a state in which the auxiliary circuit board having the still other projecting portions is inserted into the main circuit board.

As still another modification of a projecting portion, as shown in FIGS. 24A and 24B, a structure in which electronic parts 16 are mounted below the other electronic parts mounted on the auxiliary circuit board 11 is employed. In this manner, the auxiliary circuit board 11 can be fixed to the main circuit board 10 perpendicularly to the main circuit board 10 by the electronic parts 16 mounted on the auxiliary circuit board 11 without preparing an additional member for perpendicularly holding the auxiliary circuit board 11, so that the cost can be further reduced.

Figure 25A:
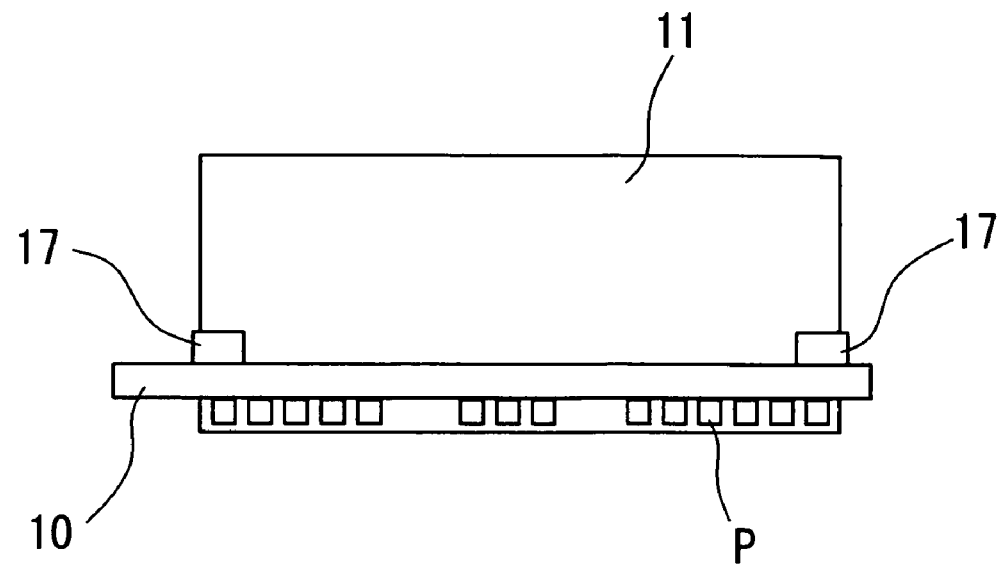
FIG. 25A is a front view of the auxiliary circuit board having different projecting portions.
Figure 25B:
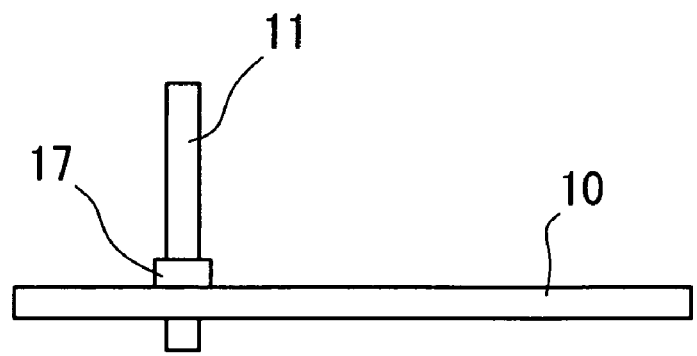
FIG. 25B is a side view showing a state in which the auxiliary circuit board having the different projecting portions is inserted into the main circuit board.
Figure 25C:
FIG. 25C is a perspective view of the different projecting portions.

As a different modification of a projecting portion, as shown in FIGS. 25A to 25C, a structure in which a jig 17 having an almost- U-shaped section and surrounding both the upper and lower surfaces of the auxiliary circuit board 11 are attached to at least one end of the auxiliary circuit board 11 in the longitudinal direction is employed. In this manner, the auxiliary circuit board 11 can be fixed to the auxiliary circuit board 11 perpendicularly to the main circuit board 10 without performing any special process to the main circuit board 10. According to this structure, only one jig 17 just has to be used for holding the auxiliary circuit board 11 perpendicularly to the main circuit board 10. When two jigs 17 are used on both the ends of the auxiliary circuit board 11, the auxiliary circuit board 11 can be more stably held. In the jig 17, a portion which sandwiches the auxiliary circuit board 11 preferably has a width almost equal to that of the auxiliary circuit board 11. In this manner, the auxiliary circuit board 11 can be reliably held by the jig 17, and the auxiliary circuit board 11 can be more stably fixed to the main circuit board 10.

Tenth Embodiment

Figure 26A:
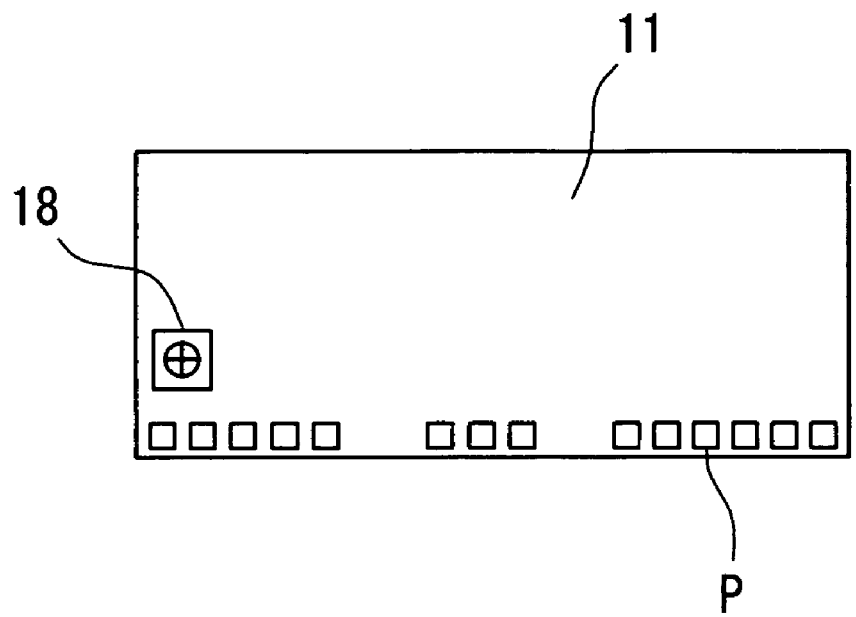
FIG. 26A is a front view of an auxiliary circuit board in the eighth embodiment of the present invention.

The tenth embodiment of a high-pressure discharge lamp lighting device according to the present invention will be described below with reference to FIGS. 26A and 26B.

This embodiment is related to an arrangement of a variable resistor 18 serving as a stabilizer for controlling power to be supplied to the lamp DL. The variable resistor 18 is arranged at a position which is closer to the upper surface of the main circuit board 10 than almost a half of the height, with reference to the surface of the main circuit board 10, of the auxiliary circuit board 11 which is inserted in and fixed to the main circuit board 10.

Figure 26B:
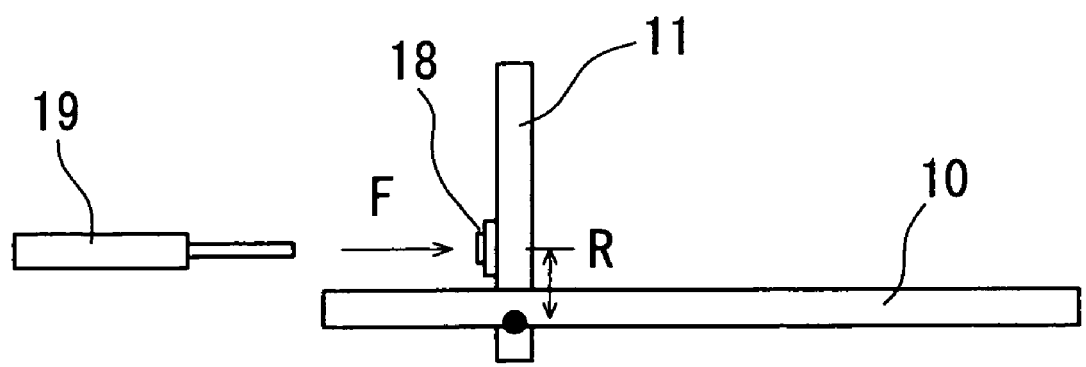
FIG. 26B is a side view showing a manner of controlling a resistance of a variable resistor in a state in which the auxiliary circuit board is connected to the main circuit board.

After the electronic parts are mounted, when the variable resistor 18 mounted on the auxiliary circuit board 11 is adjusted by using another output control rod 19 to control a power supplied to the lamp DL, a force F [N] as shown in FIG. 26B acts on the solder joint portion between the main circuit board 10 and the auxiliary circuit board 11 because the variable resistor 18 while adjusted is pushed by the output control rod 10. Therefore, in the embodiment, the variable resistor 18 is soldered at a portion indicated by a black circle, and the variable resistor 18 is mounted such that the center of the variable resistor 18 is located to a position spaced apart from the main circuit board 10 by R=7 mm, i.e., a position having a half or less of the height of the auxiliary circuit board 11 which is placed on the upper surface (parts surface) of the main circuit board 10 with a height of, e.g., 21 mm. In this manner, a torque T [N·m]=F [N]×R [m] obtained by a moment of force acting on the auxiliary circuit board 11 can be reduced, and stress on the soldered portion between the auxiliary circuit board 11 and the main circuit board 10 can be reduced. In this equation, the reference symbol "R" denotes a distance [m] from the soldered portion to the variable resistor 18.

Eleventh Embodiment

The eleventh embodiment of a high-pressure discharge lamp lighting device according to the present invention will be described below with reference to FIGS. 27A to 27D.

Figure 27A:
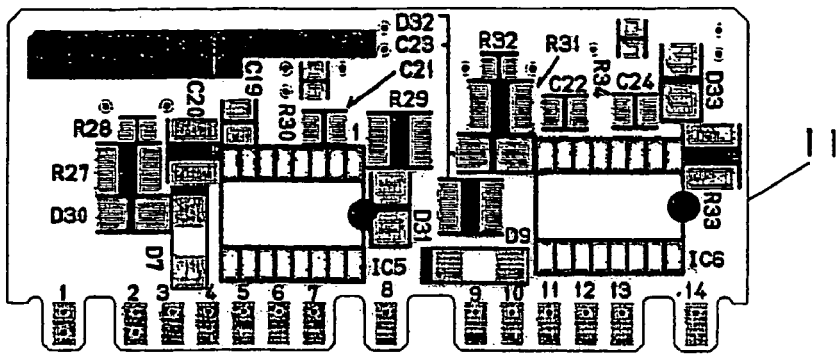
FIG. 27A is a front view showing a parts surface side of a first auxiliary circuit board in the ninth embodiment of the present invention.
Figure 27B:
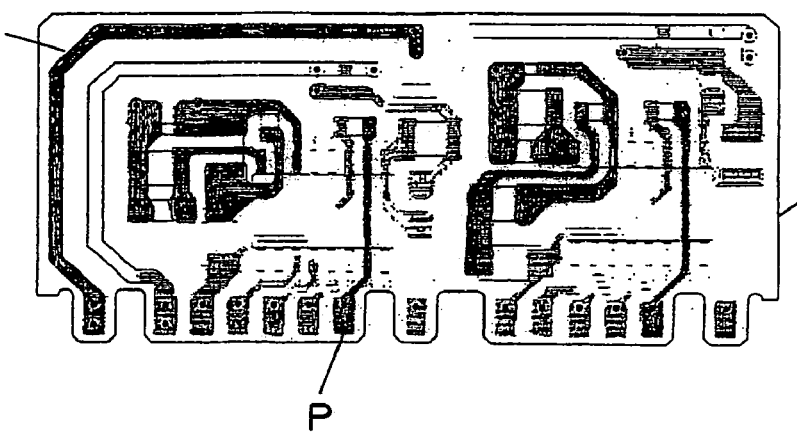
FIG. 27B is a rear view showing a wiring pattern of the first auxiliary circuit board.
Figure 27C:
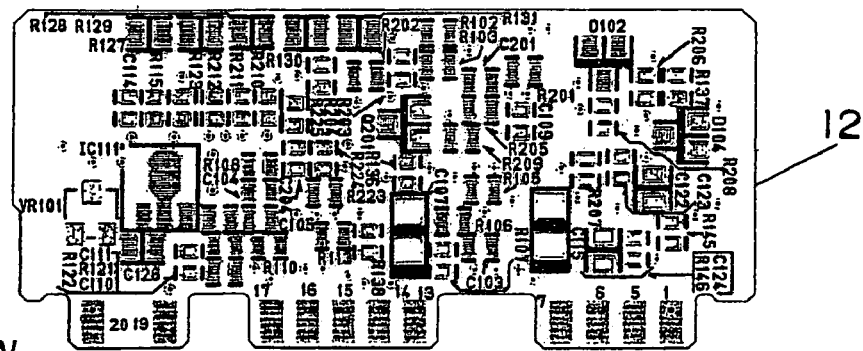
FIG. 27C is a front view showing a parts surface of a second auxiliary circuit board.
Figure 27D:
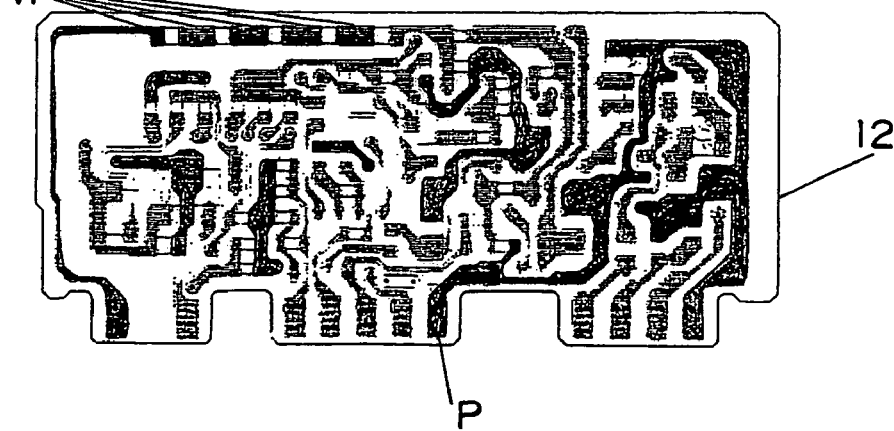
FIG. 27D is a rear view showing a wiring pattern of the second auxiliary circuit board.
Figure 28:
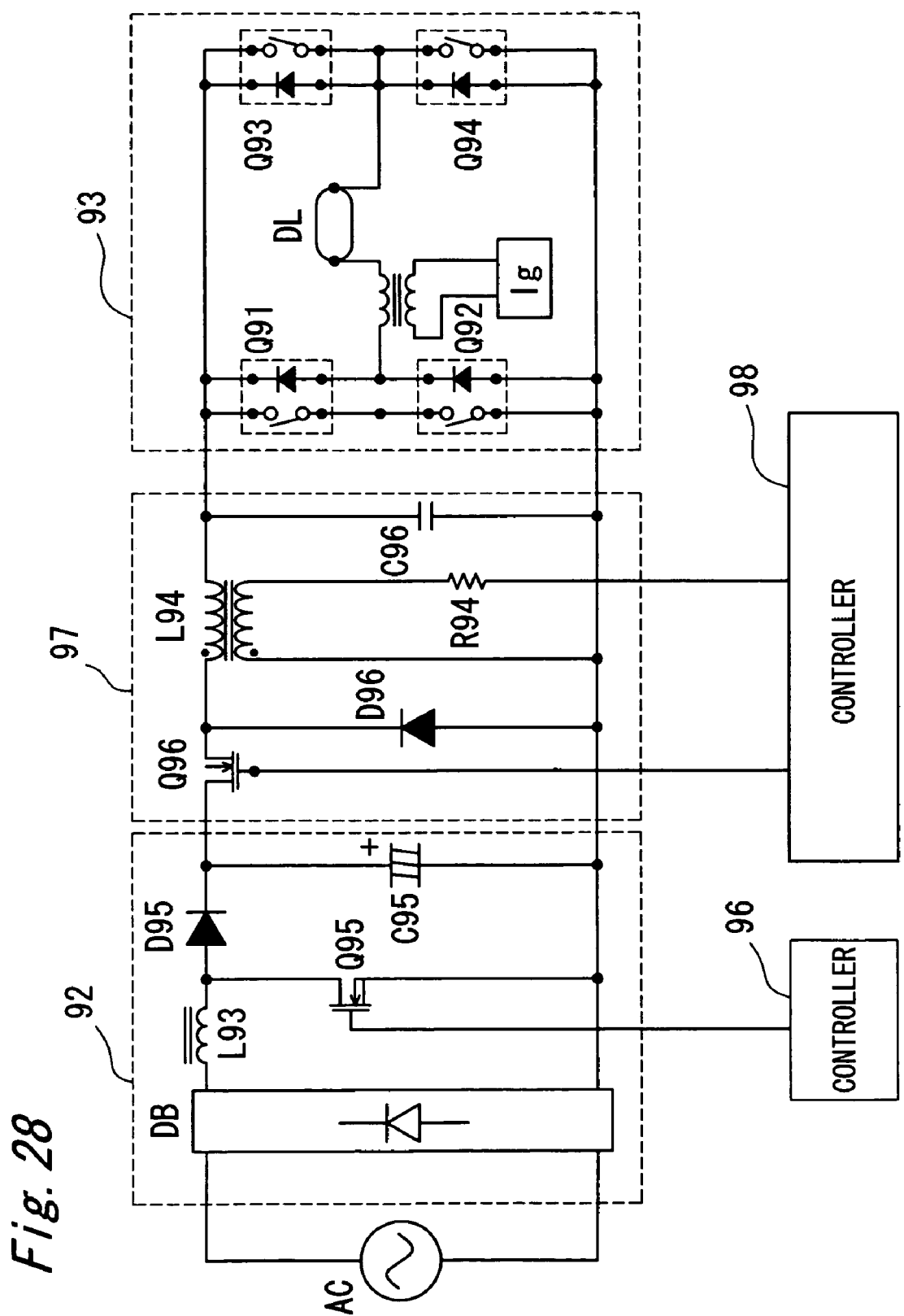
FIG. 28 is a circuit diagram showing a basic configuration of a conventional high-pressure discharge lamp lighting device.

FIG. 27A shows a parts surface of the auxiliary circuit board 11, FIG. 27B shows a wiring pattern on the auxiliary circuit board 11, FIG. 27C shows a parts surface of the second auxiliary circuit board 12, and FIG. 27D shows a wiring pattern on the auxiliary circuit board 12.

This embodiment is related to a wiring shape when a high-pressure wiring and a small-power wiring for control are arranged on one auxiliary circuit board to reduce the circuit in size. On a printed circuit board, especially, in small-size design, a plurality of electronic parts are densely arranged on the printed board, and thus the circuit desirably employs a structure strong to self-noise. Therefore, as shown in FIG. 27B, a high-pressure wiring W is provided to surround the electronic parts mounted on the auxiliary circuit board 11. The high-pressure wiring W functions as a guard ring to protect the electronic parts group from noise, thereby preventing the parts such as the control circuit from operating erroneously.

In the eighth to eleventh embodiments, the terminal pads P formed on both the upper and lower surfaces of the lower part of the auxiliary circuit board 11 are preferably arranged at symmetrical positions of the both surfaces of the auxiliary circuit board 11. This can reduce a bias of stress generated by soldering between the main circuit board 10 and the auxiliary circuit board 11 in a process of soldering the boards 10 and 11. In addition, in this case, the terminal pads P formed at the symmetrical positions of both the upper and lower surfaces of the lower part of the auxiliary circuit board 11 preferably have electrically the same potential.

Industrial Applicability

As described above, the high-pressure discharge lamp lighting device according to the present invention and a light fixture equipped with the high-pressure discharge lamp lighting device are preferable for use to light a high-pressure discharge lamp with a small space The present invention has been described with respect to the specific embodiments. However, it is apparent for a person skilled in the art that a large number of other modifications, corrections, and uses can be effected. Therefore, the present invention is not limited to the specific disclosure mentioned here, and is limited only by the accompanying claims. This application is related to Japanese Patent Application Nos. 2002-312484 (filled on Oct. 28, 2002) and 2002-318934 (filed on Oct. 31, 2002), the contents of which are incorporated herein by reference.

The invention claimed is:

1. A device for lighting a high-pressure discharge lamp, comprising:
   a DC power supply:
   a first switching element having one terminal connected to the high pressure side of the DC power supply;
   a second switching element having one terminal connected to the low-voltage side of the DC power supply;
   a third switching element having one terminal connected to the high pressure side of the DC power supply;
   a fourth switching element having one terminal connected to the low-voltage side of the DC power supply;
   a first inductor having one terminal connected to the other terminals of the first and second switching elements, and the other terminal connected to one terminal of the high-pressure discharge lamp;
   a first capacitor connected between an intermediate section of a winding of the first inductor and the low-voltage side of the DC power supply, and composing a first series resonant circuit together with the first inductor;
   a second capacitor having one terminal connected to the one terminal of the first inductor, and the other terminal connected to the other terminal of the high-pressure discharge lamp;
   a second inductor having one terminal connected to the other terminals of the third and fourth switching elements, and the other terminal connected to the other terminal of the second capacitor; and
   a control circuit for controlling turning on and off of the first to fourth switching elements,
   wherein, before the high-pressure discharge lamp is started up, the control circuit performs control in a first control mode which alternately switches between a state in which the first and fourth switching elements are on and the second and third switching elements are off and a state in which the first and fourth switching elements are off and the second and third switching elements are on, at a predetermined switching frequency,
   in the first control mode, the switching frequency resonates the first series resonant circuit at its harmonic frequency to generate a high voltage for starting up the high-pressure discharge lamp, and
   the switching frequency is lower than a resonant frequency of the first series resonant circuit and higher than a resonant frequency of a second series resonant circuit including the second inductor and the second capacitor.

2. The high-pressure discharge lamp lighting device according to claim 1, wherein, after the high-pressure discharge lamp is started up, the control circuit performs control in a second control mode which alternately switches at a low-frequency between,
   an operation for alert switching at a high-frequency between a state in which the first and fourth switching elements are simultaneously on, and a state in which at least one of the first and fourth switching elements is off and
   an operation for alternately switching at a high-frequency between a state in which the second and third switching elements are simultaneously on and a state in which at least one of the second and third switching elements is off.

3. The high-pressure discharge lamp lighting device according to claim 1, wherein, in the first control mode, a frequency of a high voltage generated by the first series resonant circuit is (2n+1) (n is a natural number) times the switching frequency.

4. The high-pressure discharge lamp lighting device according to claim 1, wherein the switching frequency is higher than two times the resonant frequency of a second series resonant circuit including the second inductor and the second capacitor.

5. The high-pressure discharge lamp lighting device according to claim 1, wherein the control circuit varies the switching frequency depending on time in the first control mode.

6. The high-pressure discharge lamp lighting device according to claim 5, wherein the control circuit has a digital arithmetic processing circuit, and the switching frequency is discretely varied by the digital arithmetic processing circuit.

7. The high-pressure discharge lamp lighting device according to claim 5, wherein the control circuit has an analog arithmetc processing circuit, and the switching frequency is continuously varied by the analog arithmetc processing circuit.

8. The high-pressure discharge lamp lighting device according to claim 5, wherein a variable range of the switching frequency is set such that the resonant frequency of the first series resonant circuit is included in a range from an integral multiple of the lower limit of the variable range to an integral multiple of the upper limit of the variable range.

9. The high-pressure discharge lamp lighting device according to claim 8, wherein the frequency corresponding to the integral multiple of the switching frequency is (2N +1) times (n is a natural number) the switching frequency.

10. The high-pressure discharge lamp lighting device according to claim 9, wherein the frequency corresponding to the integral multiple of the switching frequency is three times the switching frequency.

11. The high-pressure discharge lamp lighting device according to claim 1, wherein the first and second switching elements are PWM-controlled at a duty ratio of about 50%, and the first and second switching elements alternately repeat on and off-operations at equal time intervals.

12. The high-pressure discharge lamp lighting device according to claim 1, wherein the first inductor has a transformer structure provided with a primary winding and a secondary winding, one terminal of the primary winding is connected to one terminal of the secondary winding, and the first capacitor is connected to the connection point between the primary winding and the secondary winding.

13. The high-pressure discharge lamp lighting device according to claim 1, wherein the first inductor has a transformer structure provided with a primary winding and a secondary winding, and a ratio of the numbers of turns of the primary winding and the secondary winding is given by 1:N (N>1).

14. The high-pressure discharge lamp lighting device according to claim 1, wherein the first inductor has a transformer structure provided with a primary winding and a secondary winding, the primary winding is constituted by a litz wire, and the secondary winding is constituted by a single wire.

15. The high-pressure discharge lamp lighting device according to claim 1, further comprising
a start up detector operable to detect the start up of the high-pressure discharge lamp,
wherein, when the start up detector detects the start up of the high-pressure discharge lamp, the control circuit performs control in a third control mode which alternately switches at a low-frequency between,
an operation for switching at a high-frequency among, a state in which the first and fourth switching elements are simultaneously on, a state in which one of the first and fourth switching elements is off, and a state in which both the first and fourth switching elements are off, sequentially in the order, and
an operation for switching at a high-frequency among, a state in which the second and third switching elements are simultaneously on, a state in which one of the second and third switching elements is off, and a state in which both the second and third switching elements are off, sequentially in the order.

16. The high-pressure discharge lamp lighting device according to claim 15, herein a switching operation from the first control mode to the third control mode is conducted when a predetermined period of time passes after the start up of the high pressure discharge lamp is detected.

17. The high-pressure discharge lamp lighting device according to claim 15, wherein the switching frequency of the first control mode is higher than a high-frequency by which the switching elements are switched in the third control mode.

18. The high-pressure discharge lamp lighting device according to claim 1, further comprising a main circuit board and an auxiliary circuit board on which the electronic parts comprised in the high-pressure discharge lamp lighting device can be mounted,
wherein terminal pads for soldering connection to the main circuit board are formed on both the upper and lower surfaces of the lower part of the auxiliary circuit board,
a slit in which the auxiliary circuit board is inserted and which supports the auxiliary circuit board is formed in the main circuit board, and
the slit has a portion which has a first width and is electrically connected to the auxiliary circuit board and a portion which has a second width which is almost equal to or smaller than the thickness of the auxiliary circuit board, and the first width is larger than the second width.

19. The high-pressure discharge lamp lighting device according to claim 18, further comprising a variable resist for output control connected to the high-pressure discharge lamp in series and mounted on the auxiliary circuit board,
wherein, when the auxiliary circuit board is inserted into the main circuit board, the output control variable resistor is positioned at a position doser to the surface of the main circuit board than an intermediate point of a height of the highest part of the auxiliary circuit board with reference to the surface of the main circuit board.

20. The high-pressure discharge lamp lighting device according to claim 18, wherein an electric wiring pattern formed on the auxiliary circuit board includes a part to which a low voltage is applied and a part to which a high voltage is applied, and the part to which the high voltage is applied is formed on the peripheral portion of the auxiliary circuit board.

21. The high-pressure discharge lamp lighting device according to claim 18, wherein the auxiliary circuit board is arranged near the peripheral portion of the main circuit board.

22. The high-pressure discharge lamp lighting device according to claim 18, wherein the terminal pads are formed at symmetrical positions on the upper and lower surfaces of the auxiliary circuit board.

23. The high-pressure discharge lamp lighting device according to claim 22, wherein the terminal pads formed at the symmetrical positions of the upper and lower surfaces of the lower part of the auxiliary circuit board have electrically the same potential.

24. The high-pressure discharge lamp lighting device according to claim 18, wherein, projecting portions which can be in contact with the surface of the main circuit board when the auxiliary circuit board is inserted into the main circuit board is formed in a space between the terminal pads formed on the lower part of the auxiliary circuit board and an electronic parts mounted on the auxiliary circuit board, and on both the upper and lower surfaces of the auxiliary circuit board.

25. The high-pressure discharge lamp lighting device according to claim 24, wherein the projecting portion comprises a rod almost perpendicularly penetrates a hole running from the upper surface to the lower surface in the auxiliary circuit board.

26. The high-pressure discharge lamp lighting device according to claim 24, wherein the projecting portion comprises an electronic part arranged between the other electronic parts mounted on both the upper and lower surfaces of the auxiliary circuit board and the terminal pads.

27. The high-pressure discharge lamp lighting device according to claim 24, wherein the projecting portion comprises a U-shaped jig fixed to at least one end in the longitudinal direction of the auxiliary circuit board such that the jig straddles both the upper and lower surfaces of the auxiliary circuit board.

28. A light fixture comprising a high-pressure discharge lamp lighting device according to claim 1, and a high-pressure discharge lamp lighted by the high-pressure discharge lamp lighting device.

29. A device for lighting a high-pressure discharge lamp, comprising:
a DC power supply:
a first switching element having one terminal connected to the high pressure side of the DC power supply;
a second switching element having one terminal connected to the low-voltage side of the DC power supply;
a first inductor having one terminal connected to the other terminals of the first and second switching elements, and the other terminal connected to one terminal of a high-pressure discharge lamp;
a first capacitor connected between an intermediate section of a winding of the first inductor and the low-voltage side of the DC power supply and composing a first series resonant circuit together with the first inductor;
a second capacitor having one terminal connected to the one terminal of the first inductor, and the other terminal connected to the one terminal of the high-pressure discharge lamp;
a second inductor having one terminal connected to the other terminal of the second capacitor;
a third capacitor connected between the high-pressure side of the DC power supply and the other terminal of the second inductor,
a fourth capacitor connected between the low-voltage side of the DC power supply and the other terminal of the second inductor; and
a control circuit for controlling turning on and off of the first and second switching elements,
wherein before the high-pressure discharge lamp is started up, the control circuit performs control in a first control mode which alternately switches between a state in which the first switching element is on and the second switching element is off and a state in which the first switching element is off and the second switching element is on, at a predetermined switching frequency,
in the first control mode, the switching frequency resonates the first series resonant circuit at its harmonic frequency to generate a high voltage for starting up the high-pressure discharge lamp, and
the switching frequency is lower than a resonant frequency of the first series resonant circuit and higher than a resonant frequency of a second series resonant circuit including the second inductor and the second capacitor.

30. The high-pressure discharge lamp lighting device according to claim 29, wherein after the high-pressure discharge lamp is started up, the control circuit performs control in a second control mode which alternately switches at a first low-frequency between an operation for controlling turning on and off of the first switching element at a high-frequency and an operation for controlling turning on and off the second switching element at a high-frequency.

31. The high-pressure discharge lamp lighting device according to claim 29, wherein, in the first control mode, a frequency of a high voltage generated by the first series resonant circuit is (2n+1) (n is a natural number) times the switching frequency.

32. The high-pressure discharge lamp lighting device according to claim 29, wherein the switching frequency is higher than two times the resonant frequency of a second series resonant circuit including the second inductor and the second capacitor.

33. The high-pressure discharge lamp lighting device according to claim 29, wherein the control circuit varies the switching frequency depending on time in the first control mode.

34. The high-pressure discharge lamp lighting device according to claim 33, wherein the control circuit has a digital arithmetic processing circuit, and the switching frequency is disc varied by the digital arithmetic processing circuit.

35. The high-pressure discharge lamp lighting device according to claim 33, wherein the control circuit has an analog arithmetic processing circuit, and the switching frequency is continuously varied by the analog arithmetic processing circuit.

36. The high-pressure discharge lamp lighting device according to claim 33, wherein a variable range of the switching frequency is set such that the resonant frequency of the first series resonant circuit is included in a range from an integral multiple of the lower limit of the variable range to an integral multiple of the upper limit of the variable range.

37. The high-pressure discharge lamp lighting device according to claim 36, wherein the frequency corresponding to the integral multiple of the switching frequency is (2N+1) times (n is a natural number) the switching frequency.

38. The high-pressure discharge lamp lighting device according to claim 37, wherein the frequency corresponding to the integral multiple of the switching frequency is three times the switching frequency.

39. The high-pressure discharge lamp lighting device according to claim 29, wherein the first and second switching elements are PWM-controlled at a duty ratio of about 50%, and the first and second switching elements ateratey repeat on and off-operations at equal time intervals.

40. The high-pressure discharge lamp lighting device according to claim 29, wherein the first inductor has a transformer structure provided with a primary winding and a secondary winding, one terminal of the primary winding is connected to one terminal of the secondary winding, and the first capacitor is connected to the connection point between the primary winding and the secondary winding.

41. The high-pressure discharge lamp lighting device according to claim 29, wherein the first inductor has a transformer structure provided with a primary winding and a secondary winding, and a ratio of the numbers of turns of the primary winding and the secondary winding is given by 1:N (N>1).

42. The high-pressure discharge lamp lighting device according to claim 29, wherein the first inductor has a transformer structure provided with a primary winding and a secondary winding, the primary winding is constituted by a litz wire, and the secondary winding is constituted by a single wire.

43. The high-pressure discharge lamp lighting device according to claim 29, further comprising a main circuit board and an auxiliary circuit board on which the electronic parts comprised in the high-pressure discharge lamp lighting device can be mounted,
wherein terminal pads for soldering connection to the main circuit board are formed on both the upper and lower surfaces of the lower part of the auxiliary circuit board, a slit in which the auxiliary circuit board is inserted and which supports the auxiliary circuit board is formed in the main circuit board, and the slit has a portion which has a first width and is electrically connected to the auxiliary circuit board and a portion which has a second width which is almost equal to or smaller than the thickness of the auxiliary circuit board, and the first width is larger than the second width.

44. The high-pressure discharge lamp lighting device according to claim 43, further comprising a variable resistor for output control connected to the high-pressure discharge lamp in series and mounted on the auxiliary circuit board,
wherein, when the auxiliary circuit board is inserted into the main circuit board, the output control variable resistor is positioned at a position doser to the surface of the main circuit board than an intermediate point of a height of the highest part of the auxiliary circuit board with reference to the surface of the main circuit board.

45. The high-pressure discharge lamp lighting device according to claim 43, wherein an electric wiring pattern formed on the auxiliary circuit board includes a part to which a low voltage is applied and a part to which a high voltage is applied, and the part to which the high voltage is applied is formed on the peripheral portion of the auxiliary circuit board.

46. The high-pressure discharge lamp lighting device according to claim 43, wherein the auxiliary circuit board is arranged near the peripheral portion of the main circuit board.

47. The high-pressure discharge lamp lighting device according to claim 43, wherein the terminal pads are formed at symmetrical positions on the upper and lower surfaces of the auxiliary circuit board.

48. The high-pressure discharge lamp lighting device according to claim 47, wherein the terminal pads formed at the symmetrical positions of the upper and lower surfaces of the lower part of the auxiliary circuit board have electrically the same potential.

49. The high-pressure discharge lamp lighting device according to claim 43, wherein, projecting portions which can be in contact with the surface of the main circuit board when the auxiliary circuit board is inserted into the main circuit board is formed in a space between the terminal pads formed on the lower part of the auxiliary circuit board and an electronic parts mounted on the auxiliary circuit board, and on both the upper and lower surfaces of the auxiliary circuit board.

50. The high-pressure discharge lamp lighting device according to claim 49, wherein the projecting portion comprises a rod almost perpendicularly penetrates a hole running from the upper surface to the lower surface in the auxiliary circuit board.

51. The high-pressure discharge lamp lighting device according to claim 49, wherein the projecting portion comprises an electronic part arranged between the other electronic parts mounted on both the upper and lower surfaces of the auxiliary circuit board and the terminal pads.

52. The high-pressure discharge lamp lighting device according to claim 49, wherein the projecting portion comprises a U-shaped jig fixed to at least one end in the longitudinal direction of the auxiliary circuit board such that the jig straddles both the upper and lower surfaces of the auxiliary circuit board.

53. A light fixture comprising a high-pressure discharge lamp lighting device according to claim 29, and a high-pressure discharge lamp lighted by the high-pressure discharge lamp lighting device.

* * * * *

UNITED STATES PATENT AND TRADEMARK OFFICE
CERTIFICATE OF CORRECTION

| | |
|---|---|
| PATENT NO. | : 7,141,937 B2 |
| APPLICATION NO. | : 10/532822 |
| DATED | : November 28, 2006 |
| INVENTOR(S) | : Kumagai et al. |

Page 1 of 1

It is certified that error appears in the above-identified patent and that said Letters Patent is hereby corrected as shown below:

At column 28, line 22 (claim 2, line 6), "alert" should be --alternately--.

At column 29, line 49 (claim 16, line 2), "herein" should be --wherein--.

At column 30, line 12 (claim 19, line 2), "resist" should be --resistor--.

At column 30, line 17 (claim 19, line 7), "doser" should be --closer--.

At column 32, line 11 (claim 34, line 4), "disc" should be --discretely--.

At column 32, line 37 (claim 39, line 4), "ateratey" should be --alternately--.

At column 33, line 16 (claim 44, line 7), "doser" should be --closer--.

Signed and Sealed this

Thirteenth Day of May, 2008

JON W. DUDAS
*Director of the United States Patent and Trademark Office*